US010672978B2

(12) United States Patent
Lee et al.

(10) Patent No.: US 10,672,978 B2
(45) Date of Patent: Jun. 2, 2020

(54) METHOD OF MANUFACTURING A VARIABLE RESISTANCE MEMORY DEVICE

(71) Applicant: SAMSUNG ELECTRONICS CO., LTD., Suwon-si, Gyeonggi-do (KR)

(72) Inventors: Jung-Min Lee, Gwangmyeong-si (KR); Ju-Hyun Kim, Yongin-si (KR); Jung-Hwan Park, Seoul (KR); Se-Chung Oh, Yongin-si (KR); Dong-Kyu Lee, Suwon-si (KR); Kyung-Il Hong, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 22 days.

(21) Appl. No.: 16/122,056

(22) Filed: Sep. 5, 2018

(65) Prior Publication Data
US 2019/0148632 A1 May 16, 2019

(30) Foreign Application Priority Data
Nov. 13, 2017 (KR) .................. 10-2017-0150760

(51) Int. Cl.
| | |
|---|---|
| *H01L 43/12* | (2006.01) |
| *H01L 43/08* | (2006.01) |
| *H01L 43/10* | (2006.01) |
| *H01L 27/22* | (2006.01) |
| *H01L 45/00* | (2006.01) |
| *H01L 43/02* | (2006.01) |
| *H01L 27/24* | (2006.01) |
| *H01L 29/66* | (2006.01) |

(52) U.S. Cl.
CPC ............ *H01L 43/12* (2013.01); *H01L 27/222* (2013.01); *H01L 27/228* (2013.01); *H01L 27/2427* (2013.01); *H01L 27/2463* (2013.01); *H01L 43/02* (2013.01); *H01L 43/08* (2013.01); *H01L 43/10* (2013.01); *H01L 45/04* (2013.01); *H01L 45/06* (2013.01); *H01L 45/1233* (2013.01); *H01L 45/1675* (2013.01); *H01L 29/66795* (2013.01); *H01L 45/144* (2013.01); *H01L 45/146* (2013.01); *H01L 45/147* (2013.01)

(58) Field of Classification Search
None
See application file for complete search history.

(56) References Cited

U.S. PATENT DOCUMENTS

| | | | |
|---|---|---|---|
| 6,306,266 B1 | 10/2001 | Metin et al. | |
| 6,455,882 B1 * | 9/2002 | Nakura | .................. H01L 28/55 257/295 |
| 7,351,594 B2 | 4/2008 | Bae et al. | |
| 8,143,683 B2 | 3/2012 | Wang et al. | |
| 8,758,850 B2 | 6/2014 | Zhou et al. | |

(Continued)

*Primary Examiner* — Bradley Smith
(74) *Attorney, Agent, or Firm* — Lee IP Law, PC

(57) ABSTRACT

In a method of manufacturing a variable resistance memory device, an MTJ structure layer is formed on a substrate. The MTJ structure layer is etched in an etching chamber to form an MTJ structure. The substrate having the MTJ structure thereon is transferred to a deposition chamber through a transfer chamber. A protection layer covering a sidewall of the MTJ structure is formed in the deposition chamber. The etching chamber, the transfer chamber, and the deposition chamber are kept in a high vacuum state equal to or more than about $10^{-8}$ Torr.

18 Claims, 40 Drawing Sheets

(56) References Cited

U.S. PATENT DOCUMENTS

| | | |
|---|---|---|
| 9,028,910 B2 | 5/2015 | Zhou et al. |
| 9,159,907 B2 | 10/2015 | Tang et al. |
| 2009/0209050 A1* | 8/2009 | Wang .................... H01L 27/228 |
| | | 438/3 |
| 2012/0299132 A1 | 11/2012 | Lin |
| 2014/0353149 A1 | 12/2014 | Seino et al. |
| 2018/0076261 A1* | 3/2018 | Yoshikawa ........... H01L 27/222 |

* cited by examiner

METHOD OF MANUFACTURING A VARIABLE RESISTANCE MEMORY DEVICE

CROSS-REFERENCE TO RELATED APPLICATION

Korean Patent Application No. 10-2017-0150760, filed on Nov. 13, 2017 in the Korean Intellectual Property Office (KIPO), and entitled: "Method of Manufacturing a Variable Resistance Memory Device," is incorporated by reference herein in its entirety.

BACKGROUND

1. Field

Embodiments relate to a method of manufacturing a semiconductor device.

2. Description of the Related Art

A variable resistance device may be implemented to form a memory device. Aspects of the variable resistance device may be sensitive to oxidation during the manufacturing of the variable resistance device.

SUMMARY

Embodiments are directed to a method of manufacturing a variable resistance memory device. In the method, an MTJ structure layer may be formed on a substrate. The MTJ structure layer may be etched in an etching chamber to form an MTJ structure. The substrate having the MTJ structure thereon may be transferred to a deposition chamber through a transfer chamber. A protection layer covering a sidewall of the MTJ structure may be formed in the deposition chamber. The etching chamber, the transfer chamber, and the deposition chamber may be kept in a high vacuum state equal to or more than about 10-8 Torr.

Embodiments are also directed to a method of manufacturing a variable resistance memory device. In the method, a memory unit layer including a variable resistance layer may be formed on a substrate. The memory unit layer may be etched in an etching chamber to form a memory unit including a variable resistance pattern. The substrate having the memory unit thereon may be transferred to a deposition chamber through a transfer chamber. A protection layer covering at least a sidewall of the variable resistance pattern may be formed in the deposition chamber. The etching chamber, the transfer chamber, and the deposition chamber may be in a high vacuum state equal to or more than about 10-8 Torr.

Embodiments are also directed to a method of manufacturing a variable resistance memory device. A lower electrode layer, an MTJ structure layer, and an upper electrode layer may be sequentially formed on a substrate. An etching process may be performed in a high vacuum state equal to or more than about 10-8 Torr to etch the upper electrode layer, the MTJ structure layer, and the lower electrode layer to form an upper electrode, an MTJ structure, and a lower electrode, respectively. A deposition process may be performed in a high vacuum state equal to or more than about 10-8 Torr to form a protection layer covering sidewalls of the upper electrode, the MTJ structure, and the lower electrode. The etching process and the deposition process may be performed in-situ in the same process equipment. The substrate having the upper electrode, the MTJ structure, and the lower electrode thereon may be kept in a high vacuum state equal to or more than about 10-8 Torr between the etching process and the deposition process.

BRIEF DESCRIPTION OF THE DRAWINGS

Features will become apparent to those of skill in the art by describing in detail example embodiments with reference to the attached drawings in which.

DETAILED DESCRIPTION

Figure 1:
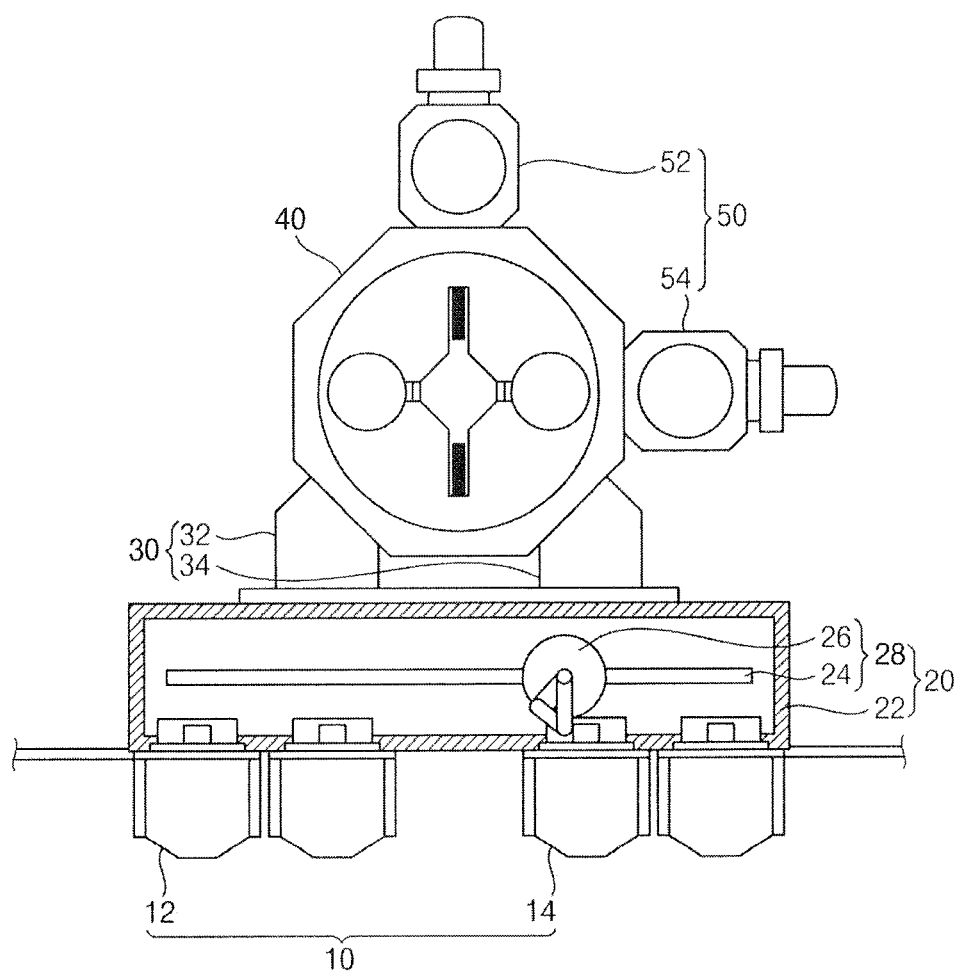
FIG. 1 illustrates a process equipment for performing an etching process and a deposition process in-situ in accordance with example embodiments.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey example implementations to those skilled in the art. In the drawing figures, the dimensions of layers and regions may be exaggerated for clarity of illustration. Like reference numerals refer to like elements throughout.

FIG. 1 shows a process equipment for performing an etching process and a deposition process in-situ in accordance with example embodiments.

Referring to FIG. 1, the process equipment may include a load port 10, a port selection module 20, a load lock chamber 30, a transfer chamber 40, and a process chamber 50.

The load port 10 may include a substrate receiving member. The substrate receiving member may include, e.g., a wafer cassette or a front opening unified pod (FOUP). In an example embodiment, the load port 10 may include a first port 12 for containing a substrate to be processed and a second port 14 for containing a substrate having already been processed.

The port selection module 20 may pull the substrate to be processed from the load port 10 and may receive the substrate having been processed from the load lock chamber 30. For example, the port selection module 20 may pull the substrate to be processed from the first port 12 to transfer it to the load lock chamber 30, or may receive the substrate having been processed from the load lock chamber 30 to transfer it to the second port 14.

The port selection module 20 may include a housing 22 and a transfer member 28 therein. The housing 22 may be disposed between the load port 10 and the load lock chamber 30, and the transfer member 28 may include a guide rail 24 extending in a direction in the housing 22, and a robot arm 26 loaded onto the guide rail 24, which may move linearly to be lined up with the first port 12 or the second port 14.

The robot arm 26 may rotate, and thus, e.g., the substrate pulled from the first port 12 may be transferred to the load lock chamber 30 by rotation of 180 degrees of the robot arm 26, and the substrate pulled from the load lock chamber 30 may be transferred to the second port 14 by rotation of 180 degrees of the robot arm 26.

The load lock chamber 30 may be disposed between the port selection module 20 and the transfer chamber 40, and may serve as an interface for transferring substrates. The load lock chamber 30 may include a first load lock chamber 32 for supplying the substrate to be processed from the port selection module 20 to the transfer chamber 40, and a second load lock chamber 34 for discharging the substrate having been processed from the transfer chamber 40 to the port selection module 20.

The process chamber 50 may include an etching chamber 52 for etching a layer on a substrate and a deposition chamber 54 for depositing a layer on a substrate.

The transfer chamber 40 may transfer a substrate between the load lock chamber 30 and the process chamber 50, and between the etching chamber 52 and the deposition chamber 54. The transfer chamber 40 may include a housing and a substrate transfer member therein. Thus, the transfer chamber 40 may transfer the substrate to be processed from the load lock chamber 30 to the process chamber 50, may transfer the substrate having been processed from the process chamber 50 to the load lock chamber 30, and may exchange the substrate between the etching chamber 52 and the deposition chamber 54.

In the present example embodiment, each of the transfer chamber 40, the etching chamber 52, and the deposition chamber 54 may be kept in a high vacuum state of at least about $10^{-8}$ Torr. Thus, a substrate may be in a high vacuum state during an etching process for etching a layer on the substrate, a deposition process for depositing a layer on the substrate, and between the etching process and the deposition process.

Figure 2:
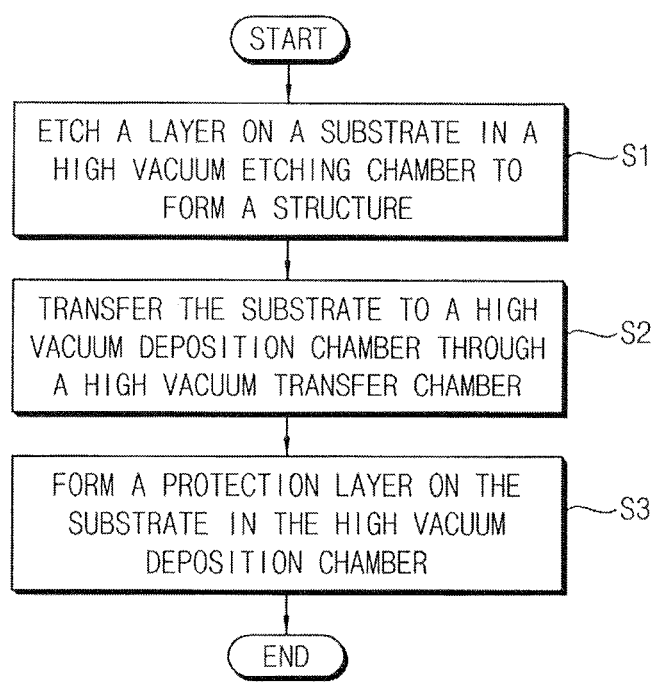
FIG. 2 illustrates a flowchart of a method of performing an etching process and a deposition process in-situ in accordance with example embodiments.

FIG. 2 is a flowchart illustrating a method of performing an etching process and a deposition process in-situ in accordance with example embodiments.

Referring to FIGS. 1 and 2, in a first operation S1, an etching process may be performed on a layer on a substrate in the etching chamber 52 kept in a high vacuum state equal to or more than about $10^{-8}$ Torr, so that a structure may be formed on the substrate.

In the present example embodiment, the etching process may include, e.g., an ion beam etching (IBE) process, a reactive ion etching (RIE) process, etc.

In a second operation S2, the substrate having the structure thereon may be transferred from the etching chamber 52 to the deposition chamber 54 through the transfer chamber 40. In the present example embodiment, each of the transfer chamber 40 and the deposition chamber 54 may be kept in a high vacuum state equal to or more than about $10^{-8}$ Torr, and thus the substrate may be kept in a high vacuum state equal to or more than about $10^{-8}$ Torr even after the etching process.

In a third operation S3, a deposition process may be performed on the substrate in the deposition chamber 54 kept in a high vacuum state equal to or more than about $10^{-8}$ Torr, and thus a protection layer may be formed on the substrate to cover the structure.

In the present example embodiment, the deposition process may include, e.g., a chemical vapor deposition (CVD) process, a physical vapor deposition (PVD) process, an atomic layer deposition (ALD) process, etc.

In an example embodiment, the substrate may be exposed to an vacuum state of no less than about $10^{-8}$ Torr during any aspect of the operations illustrated in FIG. 2.

As described above, the etching process for etching the layer on the substrate and the deposition process for forming the protection layer covering the structure on the substrate may be performed in-situ in the same process equipment kept in a high vacuum state equal to or more than about $10^{-8}$ Torr. and thus the substrate may be also kept in a high vacuum state equal to or more than about $10^{-8}$ Torr even between the etching process and the deposition process. Thus, a sidewall of the structure on the substrate may be prevented from being oxidized before forming the protection layer covering the structure.

In an example embodiment, all of the transfer chamber 40, the etching chamber 52, and the deposition chamber 54 may be kept in the same high vacuum state, and thus the substrate may be kept in the same high vacuum state continuously throughout the etching process, the deposition process, and between the etching process and the deposition process. Accordingly, the oxidation of the sidewall of the structure on the substrate may be effectively reduced or prevented.

Figure 3:
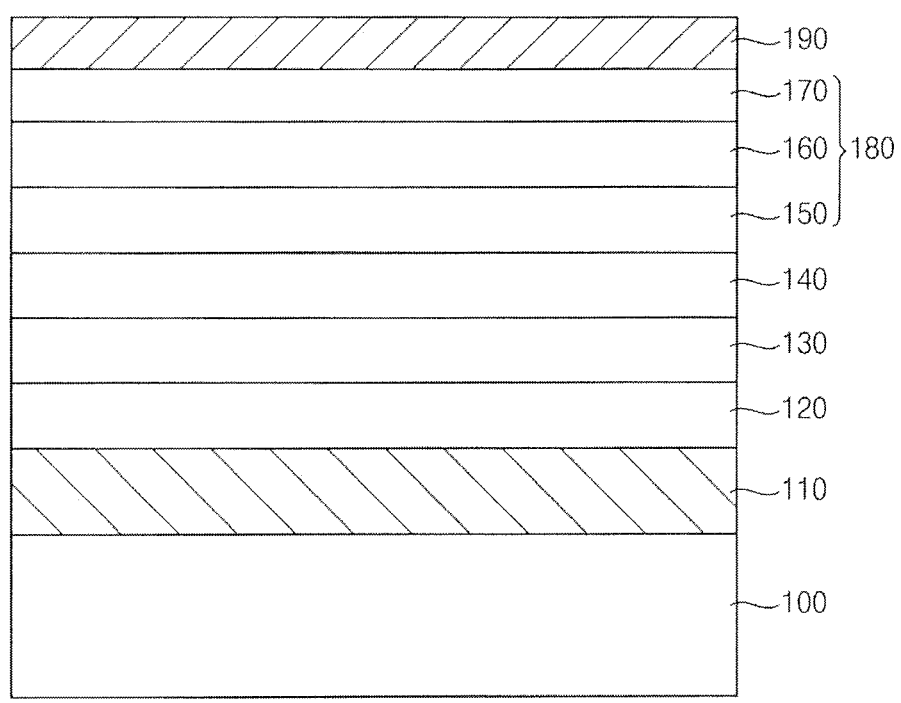
FIGS. 3 to 5 illustrate cross-sectional views of stages in a method of manufacturing an MRAM device in accordance with example embodiments.
Figure 4:
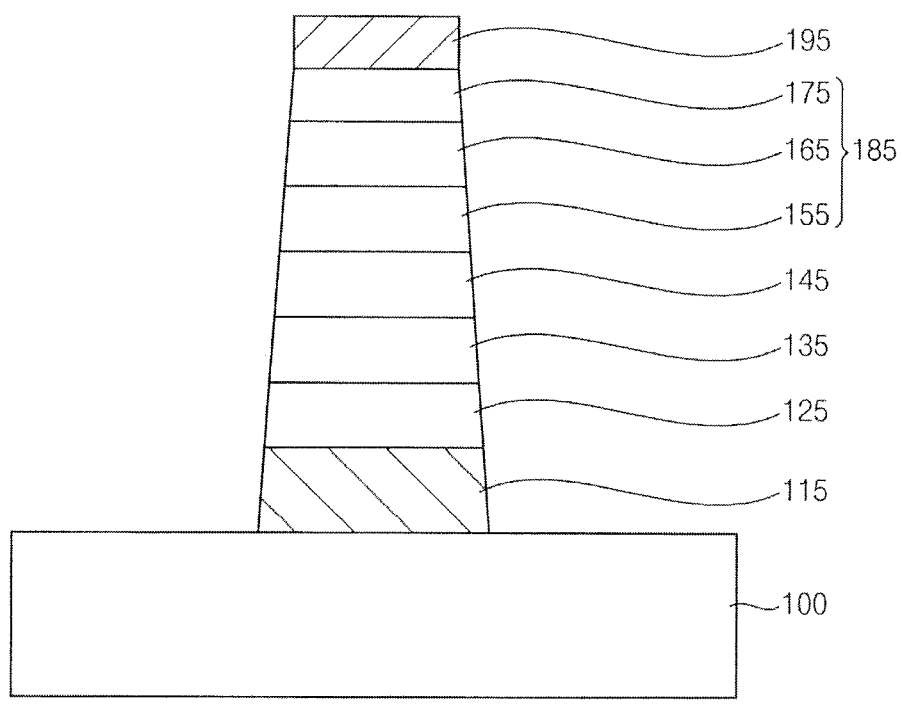
Figure 5:
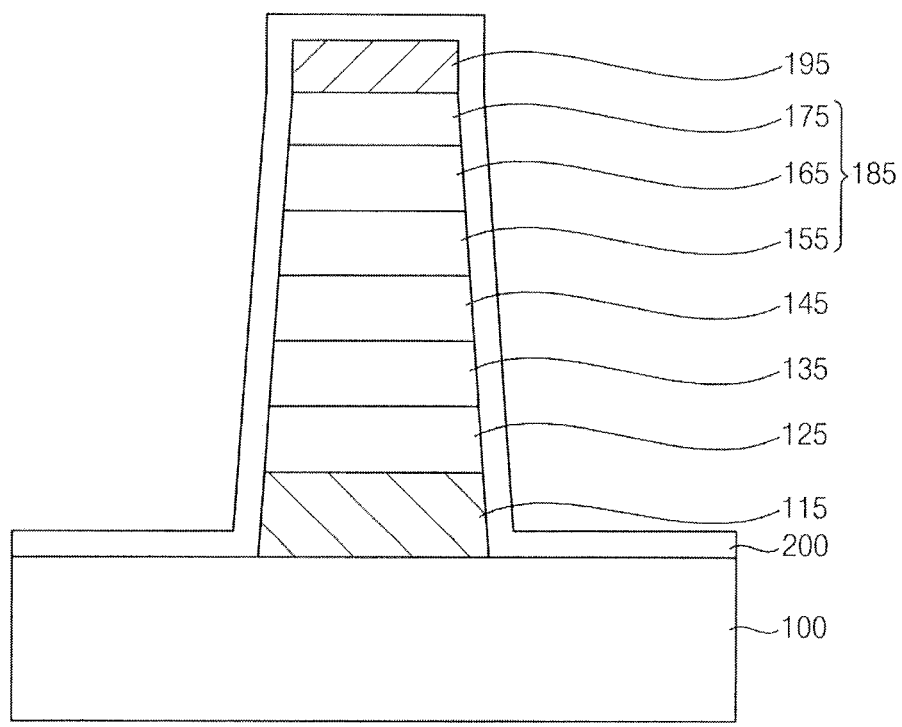

FIGS. 3 to 5 are cross-sectional views illustrating a method of manufacturing an MRAM device in accordance with example embodiments. This method may include processes substantially the same as or similar to those illustrated with reference to FIGS. 1 and 2.

Referring to FIG. 3, a lower electrode layer 110, a blocking layer 120, an adhesion layer 130, a seed layer 140, a magnetic tunnel junction (MTJ) structure layer 180, and an upper electrode layer 190 may be sequentially formed on a substrate 100 in a deposition chamber of a first process equipment. The MTJ structure layer 180 may include a fixed layer 150, a tunnel barrier layer 160, and a free layer 170 sequentially stacked.

The substrate 100 may include a semiconductor material, e.g., silicon, germanium, silicon-germanium, or III-V semiconductor compounds, e.g., GaP, GaAs, GaSb, etc. In an example embodiment, the substrate 100 may be a silicon-on-insulator (SOI) substrate or a germanium-on-insulator (GOI) substrate.

Various types of elements, e.g., word lines, transistors, diodes, source/drain layers, contacts plugs, vias, wirings, etc., and an insulating interlayer covering the elements may be formed on the substrate 100.

The lower electrode layer 110 may include a metal nitride, e.g., titanium nitride, tantalum nitride, tungsten nitride, etc. The blocking layer 120 may include a metal boride, e.g., tantalum boride, titanium boride, etc., a metal boronitride, e.g., tantalum boronitride, titanium boronitride, etc., or a metal compound, e.g., tantalum carbon fluoroborate (CF-BTa). The adhesion layer 130 may include a metal, e.g., tantalum, titanium, etc. The seed layer 140 may include a metal, e.g., ruthenium, rhenium, etc.

The fixed layer 150 may include a ferromagnetic material, e.g., cobalt, platinum, iron, nickel, etc. In an example embodiment, the fixed layer 150 may include an alloy of cobalt and platinum, i.e., CoPt, or a multi-layered structure including a cobalt layer and a platinum layer alternately stacked. The tunnel barrier layer 160 may include, e.g., magnesium oxide or aluminum oxide, and the free layer 170 may include a ferromagnetic material, e.g., cobalt, platinum, iron, nickel, etc.

In the present example embodiment, in the MTJ structure layer 180, the location of the fixed layer 150 and the free layer 170 may be changed, or at least one of the fixed layer 150, the tunnel barrier layer 160, and the free layer 170 may be formed at a plurality of levels.

The upper electrode layer 190 may include a metal, e.g., titanium, tantalum, tungsten, etc., and/or a metal nitride, e.g., titanium nitride, tantalum nitride, tungsten nitride, etc.

Each of the lower electrode layer 110, the adhesion layer 130, the seed layer 140, the MTJ structure layer 180, and the upper electrode layer 190 may be formed by, e.g., a sputtering process, a PVD process, a CVD process, an ALD process, etc.

Referring to FIG. 4, the substrate 100 having the above-illustrated structures thereon may be transferred from the first process equipment to a second process equipment, and an etching process may be performed in an etching chamber in the second process equipment.

In the present example embodiment, the second process equipment may be substantially the same as that of FIG. 1, and thus an inside of the etching chamber may be kept in a high vacuum state equal to or more than about $10^{-8}$ Torr.

The upper electrode layer 190, the MTJ structure layer 180, the seed layer 140, the adhesion layer 130, the blocking layer 120, and the lower electrode layer 110 may be sequentially etched by the etching process to form a memory unit including a lower electrode 115, a blocking pattern 125, an adhesion pattern 135, a seed pattern 145, an MTJ structure 185, and an upper electrode 195 sequentially stacked on the substrate 100. The MTJ structure 185 may include a fixed layer pattern 155, a tunnel barrier pattern 165, and a free layer pattern 175 sequentially stacked.

In the present example embodiment, the etching process may include a physical etching process, e.g., an IBE process using argon ion or krypton ion, or a chemical etching process, e.g., an RIE process.

Referring to FIG. 5, the substrate 100 having the memory unit thereon may be transferred through a transfer chamber in the second process equipment to a deposition chamber in the second process equipment, and a deposition process may be performed to form a first protection layer 200 on the substrate 100 to cover the memory unit.

In the present example embodiment, the transfer chamber and the deposition chamber may be also kept in a high vacuum state equal to or more than about $10^{-8}$ Torr. For example, the etching process and the deposition process may be performed in-situ in the same second process equipment, and the substrate 100 having the memory unit thereon may be kept in a high vacuum state equal to or more than about $10^{-8}$ Torr during the etching process, during the deposition process, and between the etching process and the deposition process.

Accordingly, a sidewall of the memory unit including the MTJ structure 185 may not be oxidized before the formation of the first protection layer 200, and thus no oxide layer may be formed on the sidewall of the memory unit. As a result, the MTJ structure 185 may have improved tunnel magnetoresistance (TMR) and retention.

In an example embodiment, the transfer chamber, the etching chamber, and the deposition chamber may be kept in substantially the same high vacuum state, and thus the substrate 100 may be kept in substantially the same high vacuum state during the etching process, during the deposition process, and between the etching process and the deposition process. Accordingly, the formation of the oxide layer on the sidewall of the memory unit may be effectively reduced or prevented.

For example, if each of the etching process and the deposition process is performed in a high vacuum state equal to or more than about $10^{-8}$ Torr, but the transfer chamber is kept in a low vacuum state, e.g., less than about $10^{-3}$ Torr, then when the substrate 100 having the memory unit thereon passes through the transfer chamber an oxide layer may be formed on the sidewall of the memory unit due to oxygen and hydrogen being more rich in the transfer chamber. For example, when the tunnel barrier pattern 165 of the MTJ structure 185 includes, e.g., magnesium oxide, a magnesium hydroxide $(Mg(OH)_2)$ layer may be formed on a sidewall of the tunnel barrier pattern 165, and thus the TMR and the retention of the MTJ structure 185 may be deteriorated. However, in the present example embodiment, the transfer chamber may be also kept in a high vacuum state equal to or more than about $10^{-8}$ Torr, and thus the formation of the oxide layer may be prevented so that the TMR and the retention may not be deteriorated.

FIGS. 6 to 30 are plan views and cross-sectional views illustrating stages in a method of manufacturing an MRAM device in accordance with example embodiments. FIGS. 6, 10, 13, and 18 are plan views, and FIGS. 7-9, 11-12, 14-17 and 19-30 are cross-sectional views. FIGS. 7-9, 11 and 19 are cross-sectional views taken along lines A-A' of corresponding plan views, FIGS. 12, 14, 16, 20, 22, 24, 26 and 28-29 are cross-sectional views taken along lines B-B' of corresponding plan views, and FIGS. 15, 17, 21, 23, 25, 27 and 30 are cross-sectional views taken along lines C-C' of corresponding plan views.

According to the present example embodiment, a method of manufacturing the MRAM device may include processes substantially the same as or similar to those illustrated with reference to FIGS. 3 to 5, and a repeated description of aspects thereof may be avoided for clarity.

Figure 6:
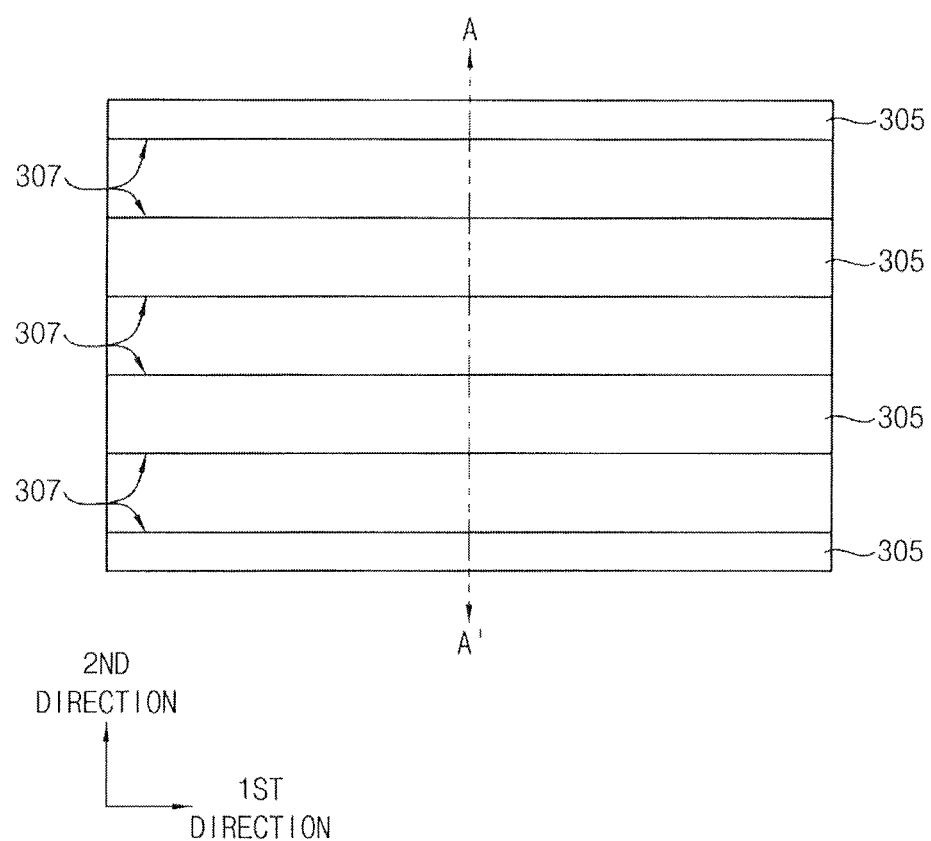
FIGS. 6 to 30 illustrate plan views and cross-sectional views of stages in a method of manufacturing an MRAM device in accordance with example embodiments.
Figure 7:
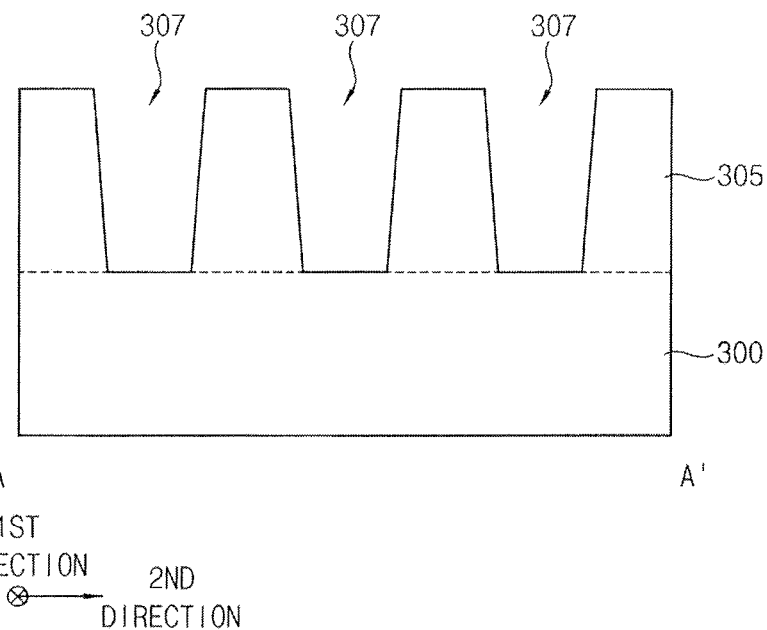

Referring to FIGS. 6 and 7, an upper portion of a substrate 300 may be partially etched to form a first recess 307.

As the first recess 307 is formed on the substrate 300, an active region 305 and a field region may be defined on the substrate 300. The active region 305 may be also referred to as an active fin. In the present example embodiment, the active fin 305 may extend in a first direction, and a plurality of active fins 305 may be formed to be arranged in a second direction, the second direction crossing the first direction.

Figure 8:
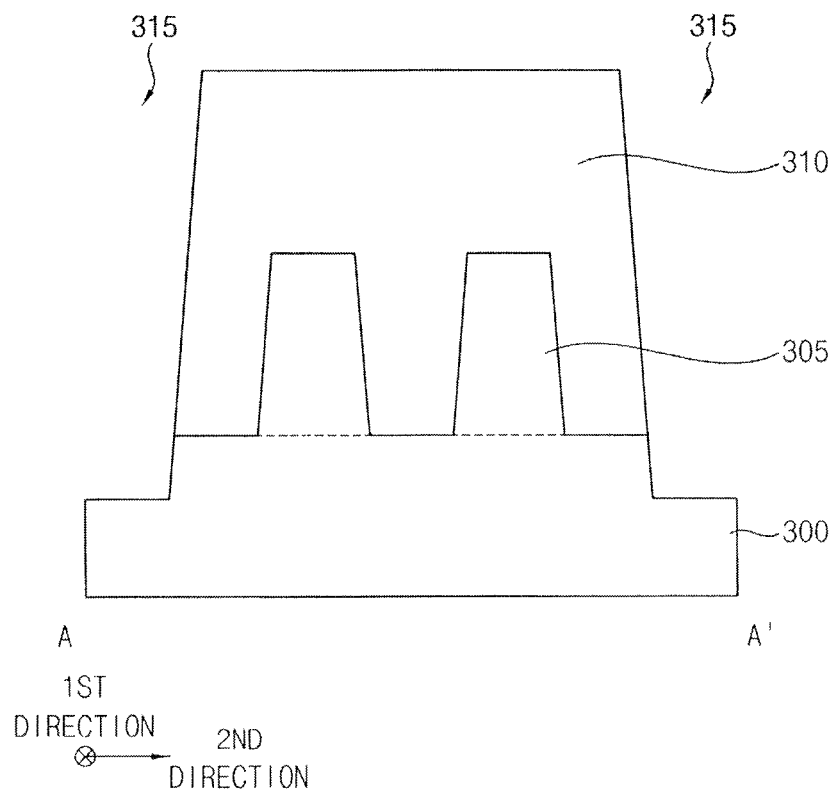

Referring to FIG. 8, a first mask 310 may be formed on a portion of the substrate 300, and a portion of the substrate 300 may be removed using the first mask 310 as an etching mask.

In the present example embodiment, a portion of the active fin 305 and a portion of the substrate 300 thereunder may be removed, and thus a second recess 315 may be formed on the substrate 300.

Figure 9:
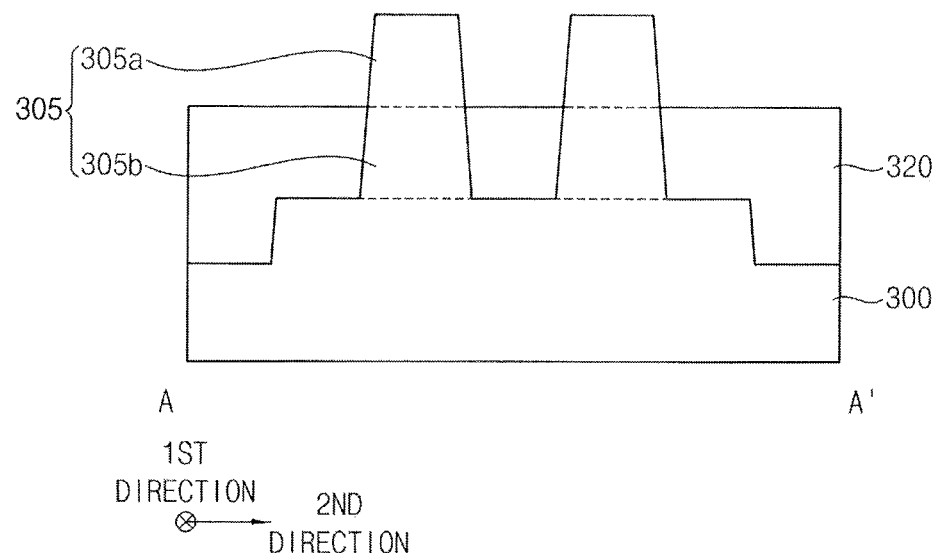

Referring to FIG. 9, after removing the first mask 310, an isolation pattern 320 may be formed on the substrate 300 to fill the second recess 315 and a portion of the first recess 307.

The isolation pattern 320 may be formed by forming an isolation layer on the substrate 300 to fill the first and second recesses 307 and 315, planarizing the isolation layer until an upper surface of the active fin 305 may be exposed, and an upper portion of the isolation layer may be removed to expose an upper sidewall of the first recess 307. As the isolation pattern 320 is formed on the substrate 300, the active fin 305 may be divided into a lower active pattern 305b of which a sidewall is covered by the isolation pattern 320, and an upper active pattern 305a protruding from an upper surface of the isolation pattern 320.

Figure 10:
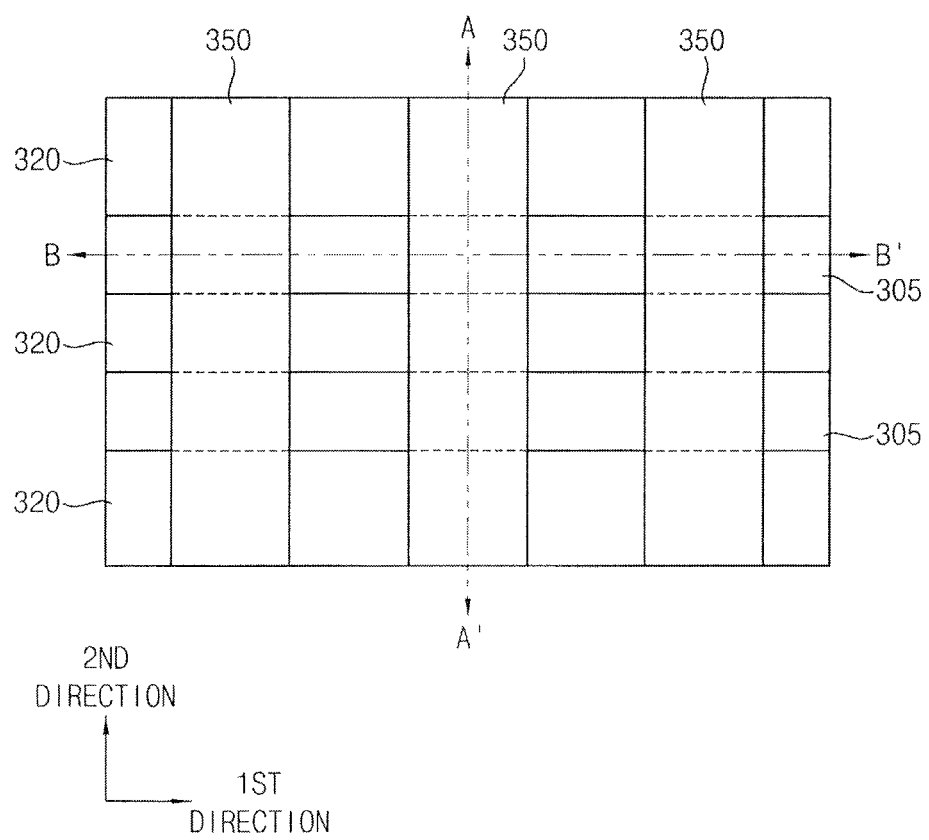
Figure 11:
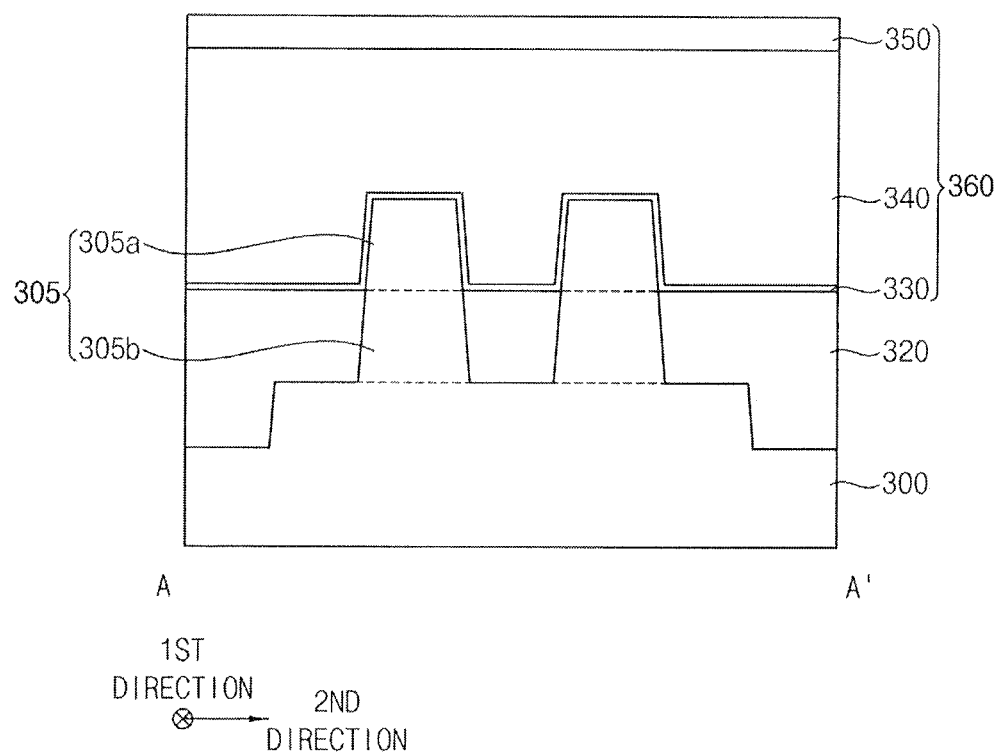
Figure 12:
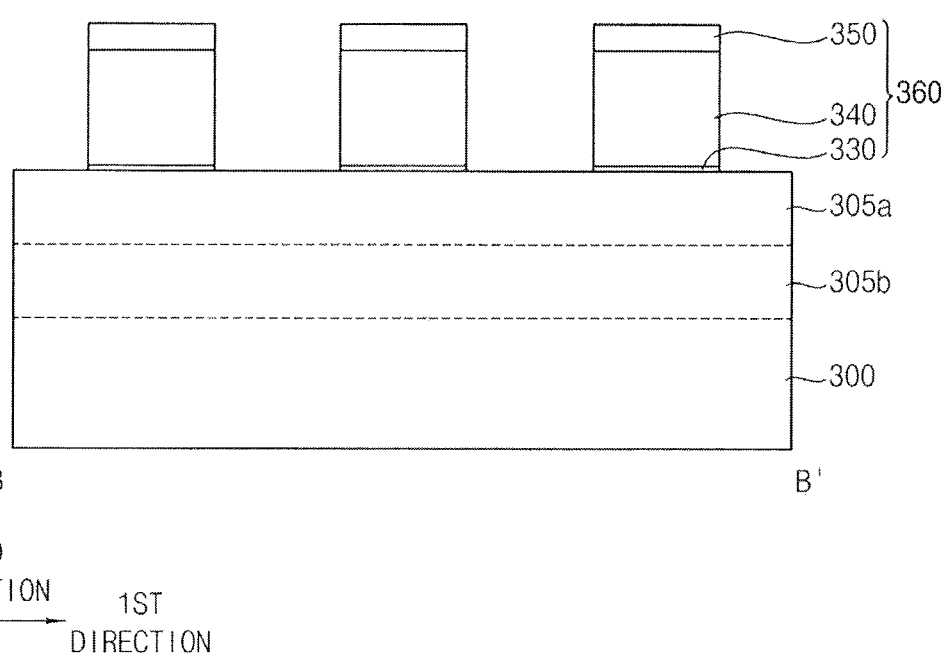

Referring to FIGS. 10 to 12, a dummy gate structure 360 may be formed on the substrate 300.

In an embodiment, the dummy gate structure 360 may be formed by sequentially forming a dummy gate insulation layer, a dummy gate electrode layer, and a dummy gate mask layer on the active fin 305 of the substrate 300 and the isolation pattern 320, patterning the dummy gate mask layer to form a dummy gate mask 350, and sequentially etching the dummy gate electrode layer and the dummy gate insulation layer using the dummy gate mask 350 as an etching mask.

Thus, the dummy gate structure 360 may include a dummy gate insulation pattern 330, a dummy gate electrode 340 and the dummy gate mask 350 sequentially stacked on the substrate 300. In the present example embodiment, the dummy gate structure 360 may extend in the second direction, and a plurality of dummy gate structures 360 may be formed in the first direction.

Figure 13:
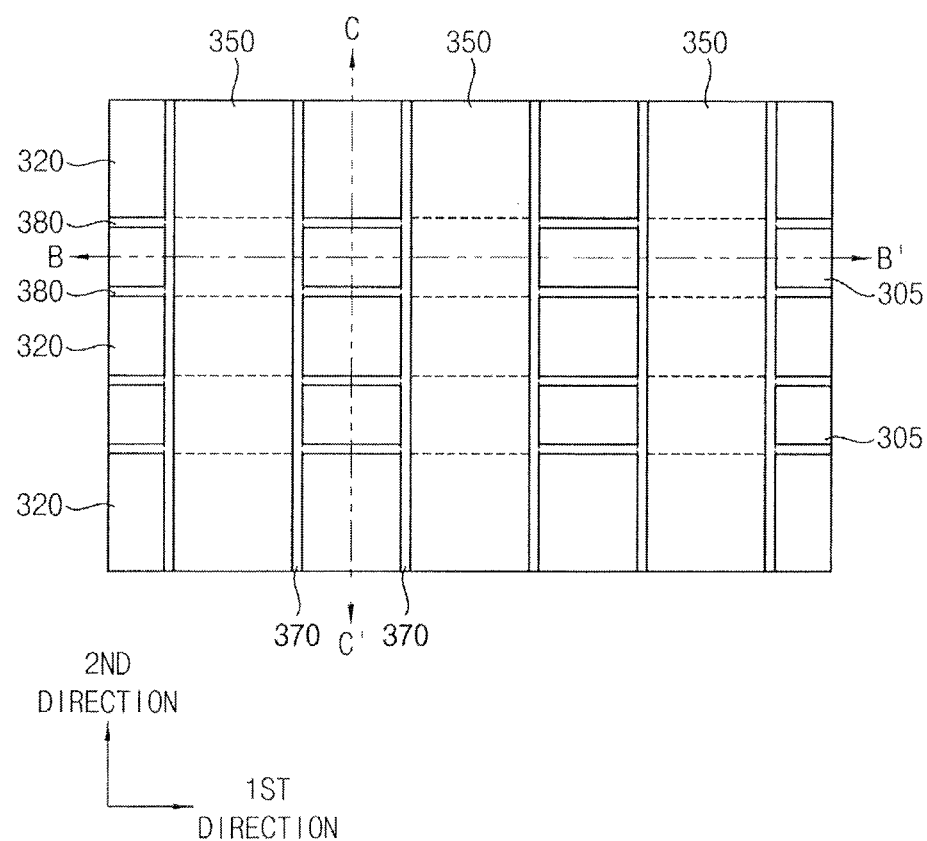
Figure 14:
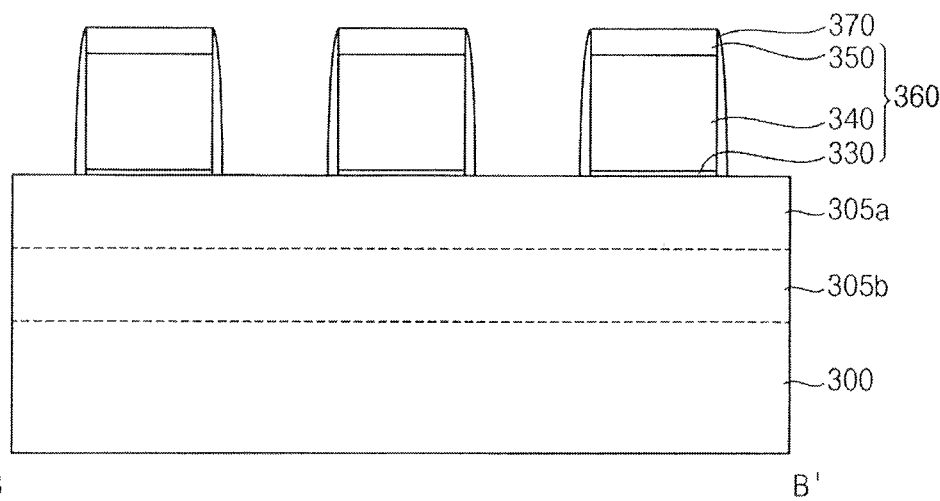
Figure 15:
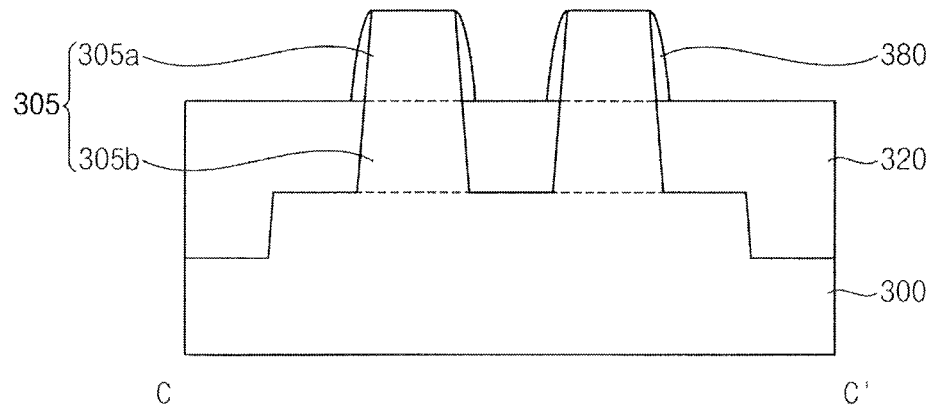

Referring to FIGS. 13 to 15, a gate spacer 370 may be formed on a sidewall of the dummy gate structure 360.

The gate spacer 370 may be formed by, e.g., forming a spacer layer on the active fin 305 of the substrate 300 and the isolation pattern 320 to cover the dummy gate structure 360, and anisotropically etching the spacer layer. The gate spacer 370 may be formed on the sidewall of the dummy gate structure 360, and a fin spacer 380 may be formed on a sidewall of the upper active pattern 305a.

Figure 16:
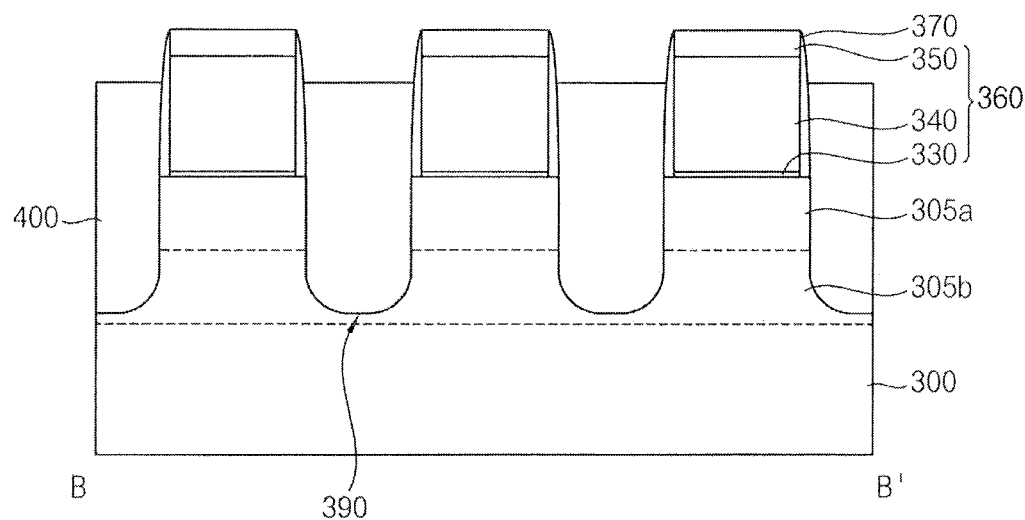
Figure 16:
Figure 17:
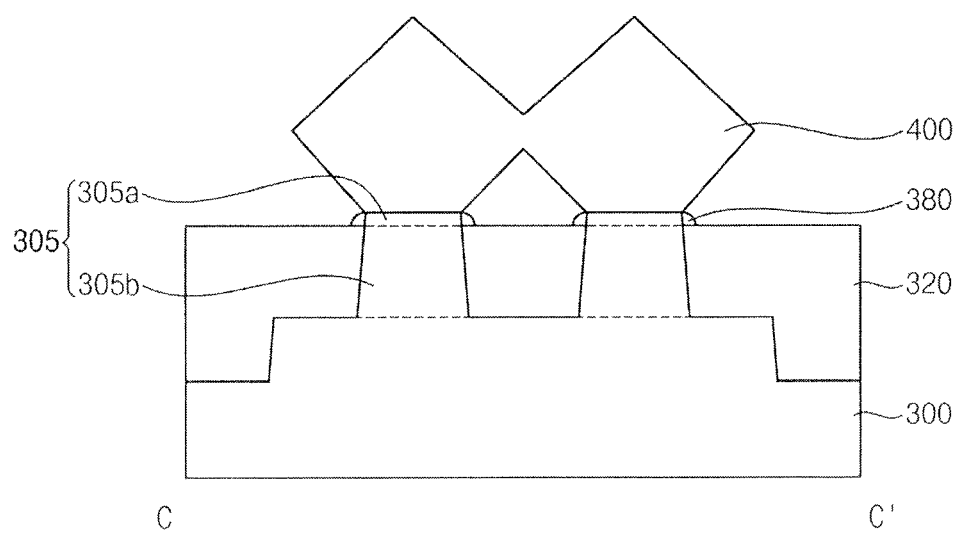
Figure 18:
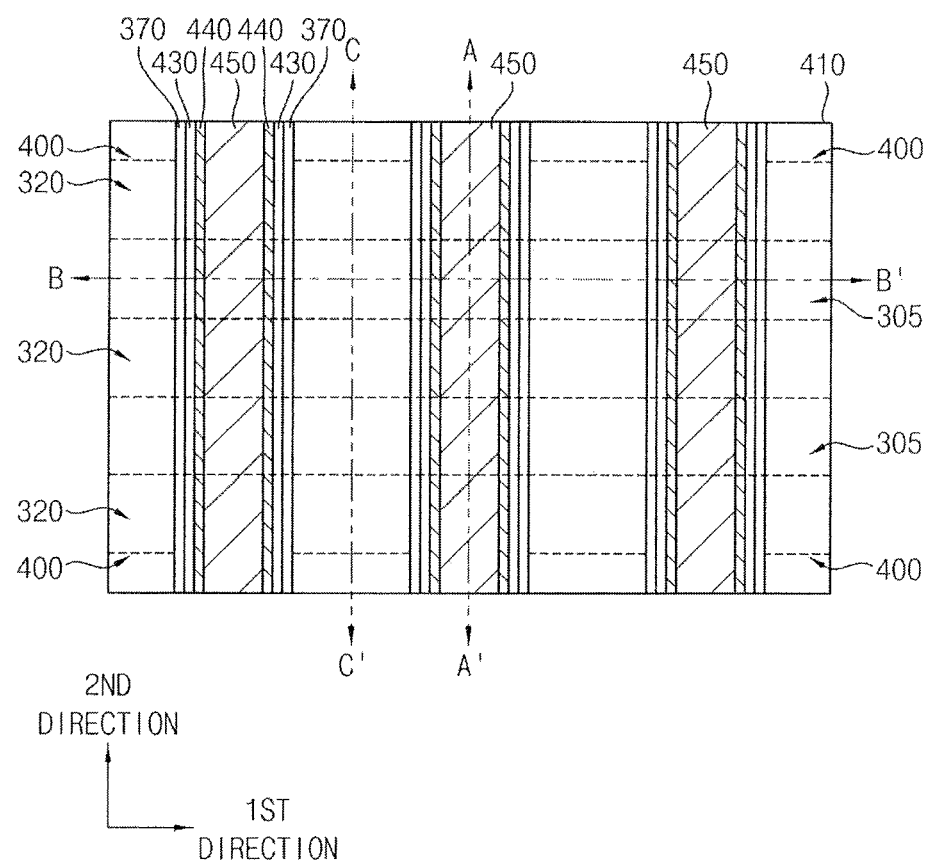
Figure 19:
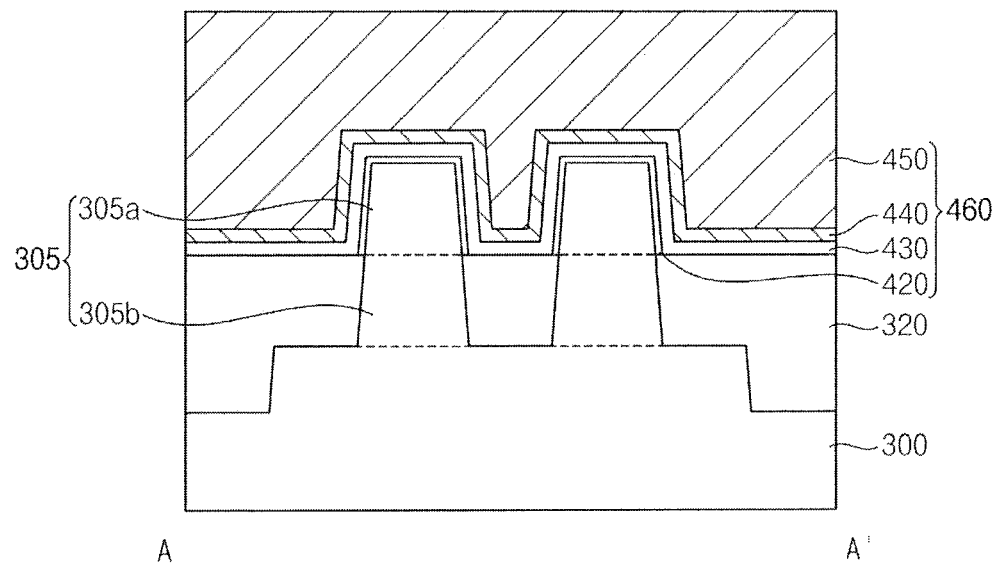
Figure 20:
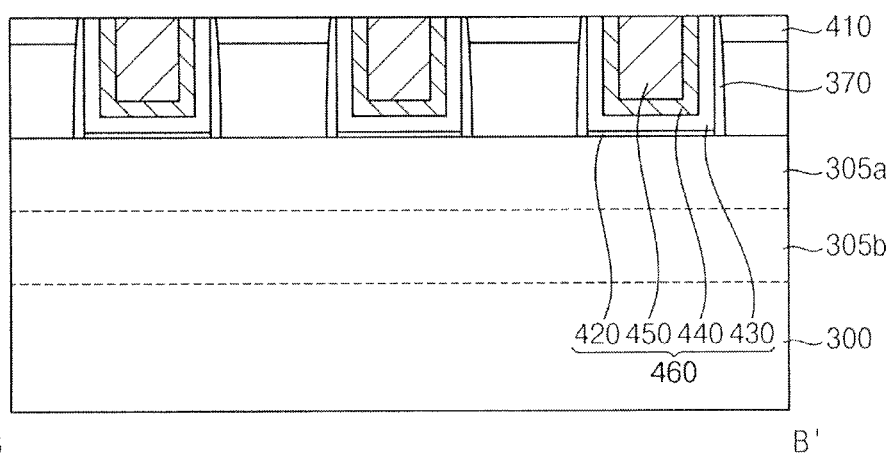
Figure 21:
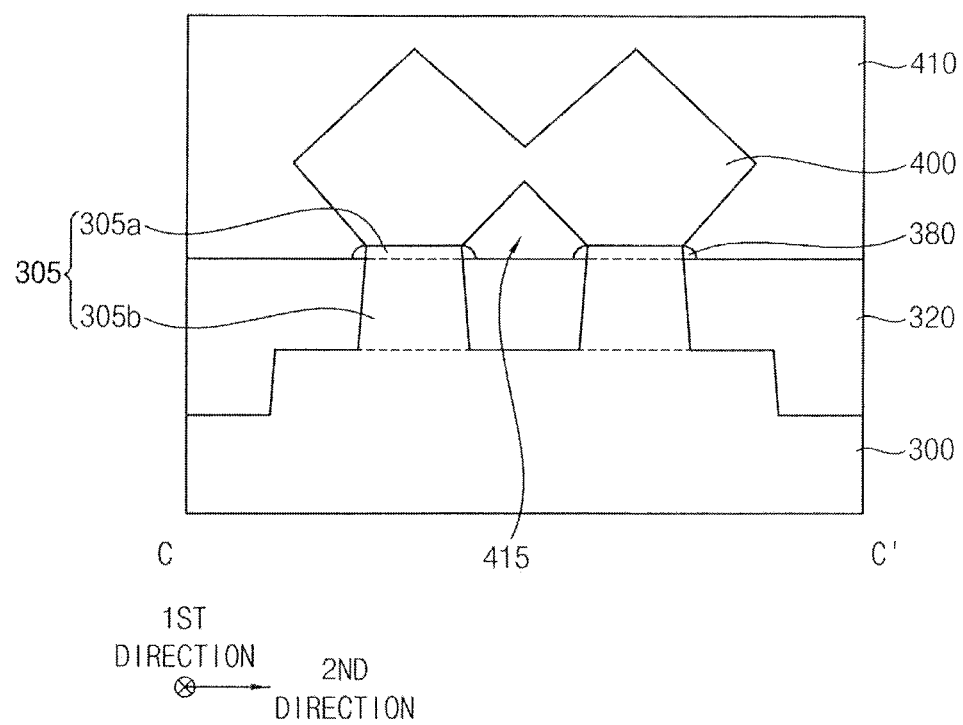

Referring to FIGS. 16 and 17, an upper portion of the active fin 305 adjacent the gate spacer 370 may be etched to form a third recess 390.

In an embodiment, the upper portion of the active fin 305 may be removed, e.g., by a dry etching process using the dummy gate structure 360 and the gate spacer 370 on the sidewall thereof as an etching mask to form the third recess 390. When the third recess 390 is formed, the fin spacer 380 adjacent the active fin 305 may be mostly removed, while a lower portion of the fin spacer 380 may remain.

A source/drain layer 400 may be formed in the third recess 390. In the present example embodiment, the source/drain layer 400 may be formed by, e.g., a selective epitaxial growth (SEG) process using an upper surface of the active fin 305 exposed by the third recess 390 as a seed.

In the present example embodiment, by the SEG process, a single crystalline silicon-germanium layer may be formed to serve as the source/drain layer 400. A p-type impurity source gas may be also used in the SEG process to form a single crystalline silicon-germanium layer doped with p-type impurities serving as the source/drain layer 400. Thus, the source/drain layer 400 may serve as a source/drain region of a positive-channel metal oxide semiconductor (PMOS) transistor.

The source/drain layer 400 may grow not only in a vertical direction but also in a horizontal direction to fill the third recess 390, and may contact a sidewall of the gate spacer 370. In the present example embodiment, when the active fins 305 disposed in the second direction are close to each other, the source/drain layers 400 growing on the respective active fins 305 may be merged with each other.

In an example embodiment, the source/drain layer 400 may serve as the source/drain region of the PMOS transistor. In an example embodiment, the source/drain layer 400 may serve as a source/drain region of a negative-channel metal oxide semiconductor (NMOS) transistor. Thus, a single crystalline silicon carbide layer or a single crystalline silicon layer may be formed as the source/drain layer 400. In the SEG process, an n-type impurity source gas, e.g., phosphine ($PH_3$) gas may be also used to form a single crystalline silicon carbide layer doped with n-type impurities.

Referring to FIGS. 18 to 21, an insulation layer 410 may be formed on the substrate 300 to cover the dummy gate structure 360, the gate spacer 370, the source/drain layer 400, and the fin spacer 380, and may be planarized until an upper surface of the dummy gate electrode 340 of the dummy gate structure 360 may be exposed.

During the planarization process, the dummy gate mask 350 may be also removed, and an upper portion of the gate spacer 370 may be removed. A space between the merged source/drain layer 400 and the isolation pattern 320 may not be fully filled, and thus an air gap 415 may be formed.

The exposed dummy gate electrode 340 and the dummy gate insulation pattern 330 thereunder may be removed to form a first opening exposing an inner sidewall of the gate spacer 370 and an upper surface of the active fin 305, and a gate structure 460 may be formed to fill the first opening.

The gate structure 460 may be formed by, e.g., the following processes. A thermal oxidation process may be performed on the exposed upper surface of the active fin 305 by the first opening to form an interface pattern 420, a gate insulation layer and a work function control layer may be sequentially formed on the interface pattern 420, the isolation pattern 320, the gate spacer 370, and the insulation layer 410, and a gate electrode layer may be formed on the work function control layer to sufficiently fill a remaining portion of the first opening.

The interface pattern 420 may be formed by, e.g., a CVD process or an ALD process instead of the thermal oxidation process, and in this case, the interface pattern 420 may be formed not only on the upper surface of the active fin 305 but also on the upper surface of the isolation pattern 320 and the inner wall of the gate spacer 370.

The gate electrode layer, the work function control layer, and the gate insulation layer may be planarized until the upper surface of the insulation layer 410 is exposed to form a gate insulation pattern 430 and a work function control pattern 440 sequentially stacked on the upper surface of the interface pattern 420, the upper surface of the isolation pattern 320, and the inner wall of the gate spacer 370, and to form a gate electrode 450 filling the remaining portion of the first opening on the work function control pattern 440. Thus, a bottom and a sidewall of the gate electrode 450 may be covered by the work function control pattern 440.

The interface pattern 420, the gate insulation pattern 430, the work function control pattern 440, and the gate electrode 450, sequentially stacked, may form the gate structure 460, and the gate structure 460 together with the source/drain layer 400 may form a PMOS transistor or an NMOS transistor according to the conductivity type of the source/drain layer 400.

Figure 22:
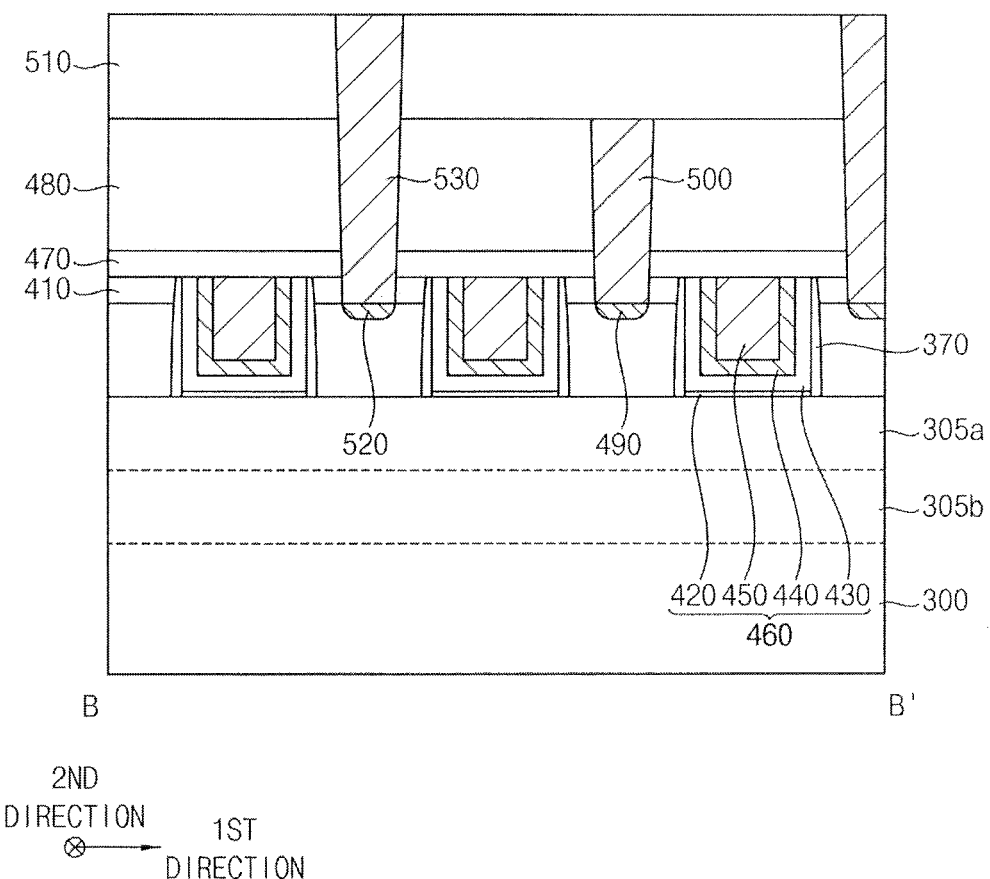
Figure 23:
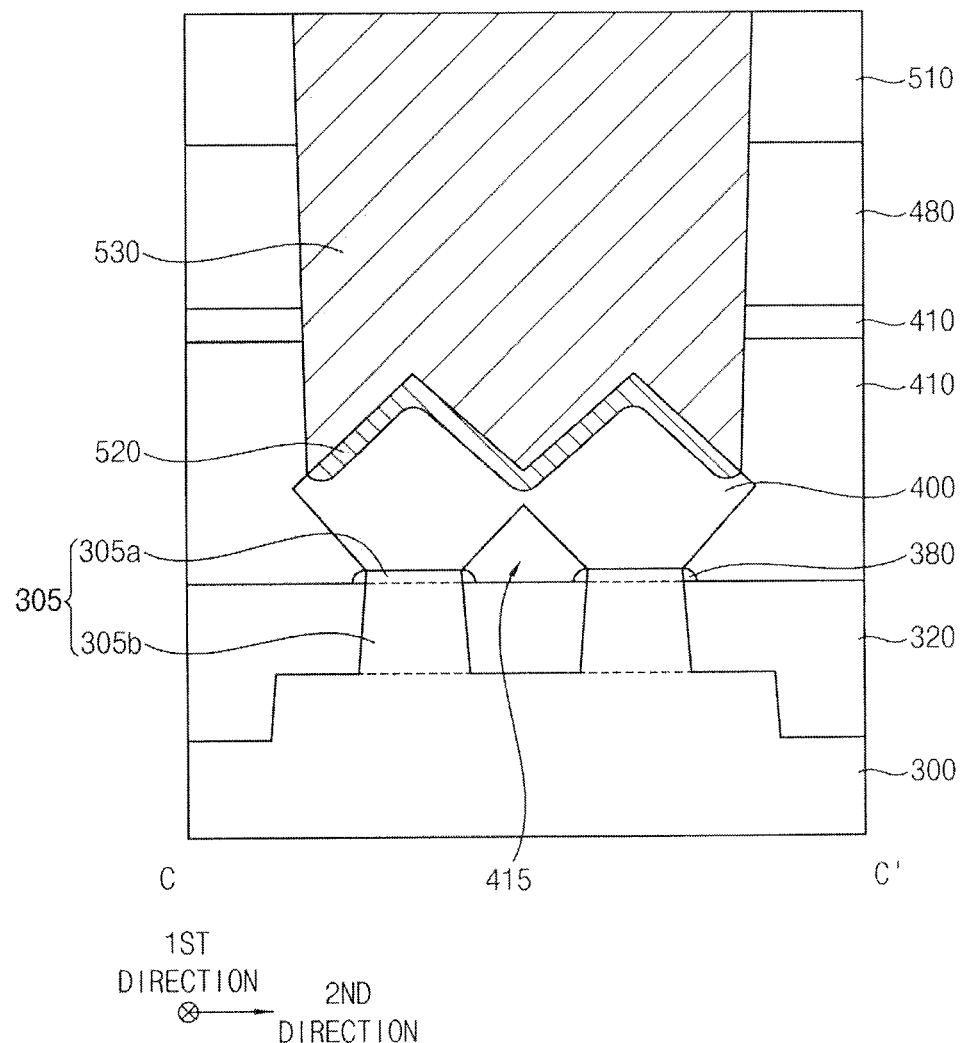

Referring to FIGS. 22 and 23, a capping layer 470 and a first insulating interlayer 480 may be sequentially formed on the insulation layer 410, the gate structure 460, and the gate spacer 370, and a source line 500 may be formed through the insulation layer 410, the capping layer 470, and the first insulating interlayer 480 to contact an upper surface of a first source/drain layer of the source/drain layers 400.

The source line 500 may be formed by, e.g., the following processes. A second opening may be formed through the insulation layer 410, the capping layer 470, and the first insulating interlayer 480 to expose the upper surface of the first source/drain layer, a first metal layer may be formed on the exposed upper surface of the first source/drain layer, a sidewall of the second opening, and an upper surface of the first insulating interlayer 480, and thermal treatment may be performed on the first metal layer to form a first metal silicide pattern 490 on the first source/drain layer.

A first barrier layer may be formed on an upper surface of the first metal silicide pattern 490, the sidewall of the second opening, and the upper surface of the first insulating interlayer 480, a first conductive layer may be formed on the first barrier layer to fill the second opening, and the first conductive layer and the first barrier layer may be planarized until the upper surface of the first insulating interlayer 480 may be exposed. Thus, the source line 500 including a first barrier pattern and a first conductive pattern sequentially stacked on the first metal silicide pattern 490 may be formed to fill the second opening.

In the present example embodiment, the source line 500 may extend in the second direction to a given length, and a plurality of source lines 500 may be formed in the first direction.

A second insulating interlayer 510 may be formed on the first insulating interlayer 480 and the source line 500, a third opening may be formed through the insulation layer 410, the capping layer 470, the first insulating interlayer 480, and the second insulating interlayer 510 to expose an upper surface of a second source/drain layer of the source/drain layers 400, a second metal layer may be formed on the exposed upper surface of the second source/drain layer, a sidewall of the third opening, and an upper surface of the second insulating interlayer 510, and thermal treatment may be performed on the second metal layer to form a second metal silicide pattern 520 on the second source/drain layer.

A second barrier layer may be formed on an upper surface of the second metal silicide pattern 520, the sidewall of the third opening, and the upper surface of the second insulating interlayer 510, a second conductive layer may be formed on the second barrier layer to fill the third opening, and the second conductive layer and the second barrier layer may be planarized until the upper surface of the second insulating interlayer 510 may be exposed. Thus, a lower contact plug 530 including a second barrier pattern and a second conductive pattern sequentially stacked on the second metal silicide pattern 520 may be formed to fill the third opening.

In the present example embodiment, a plurality of lower contact plugs 530 may be formed to be spaced apart from each other in the first direction.

Figure 24:
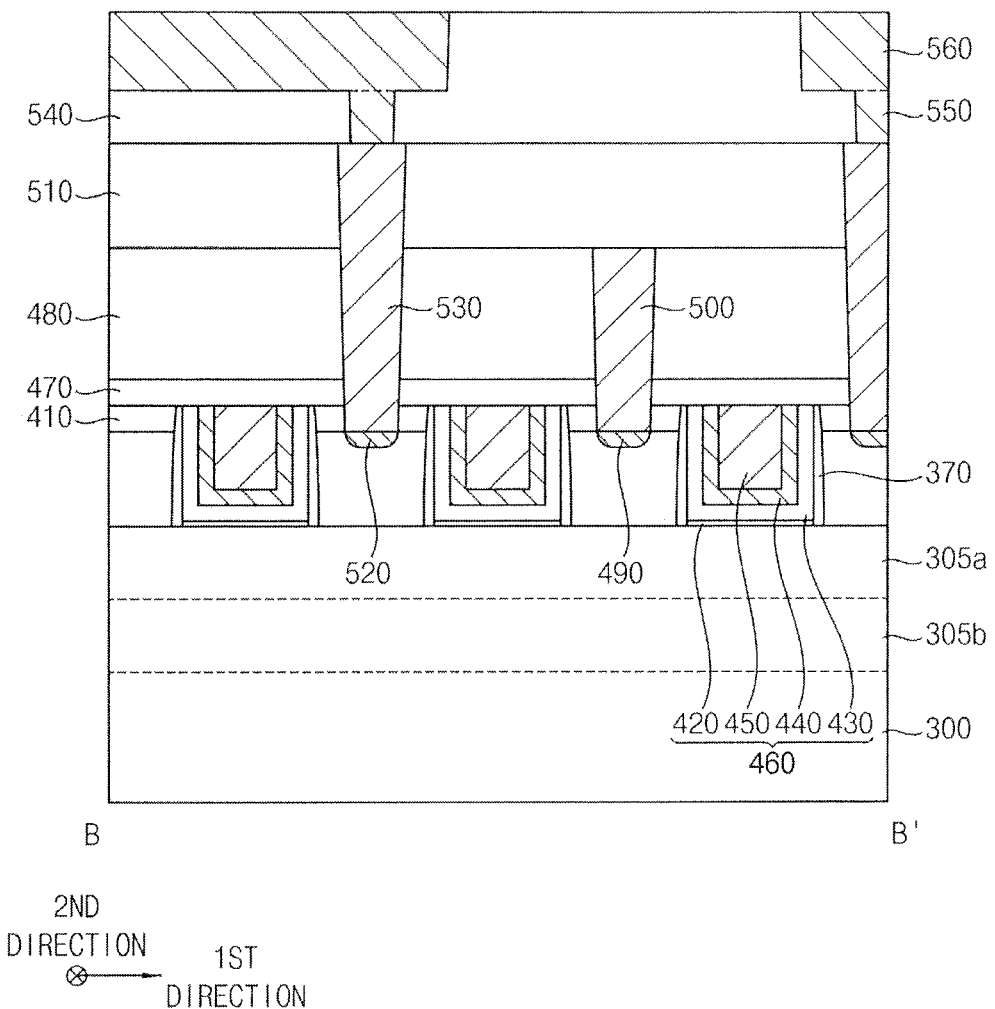
Figure 25:
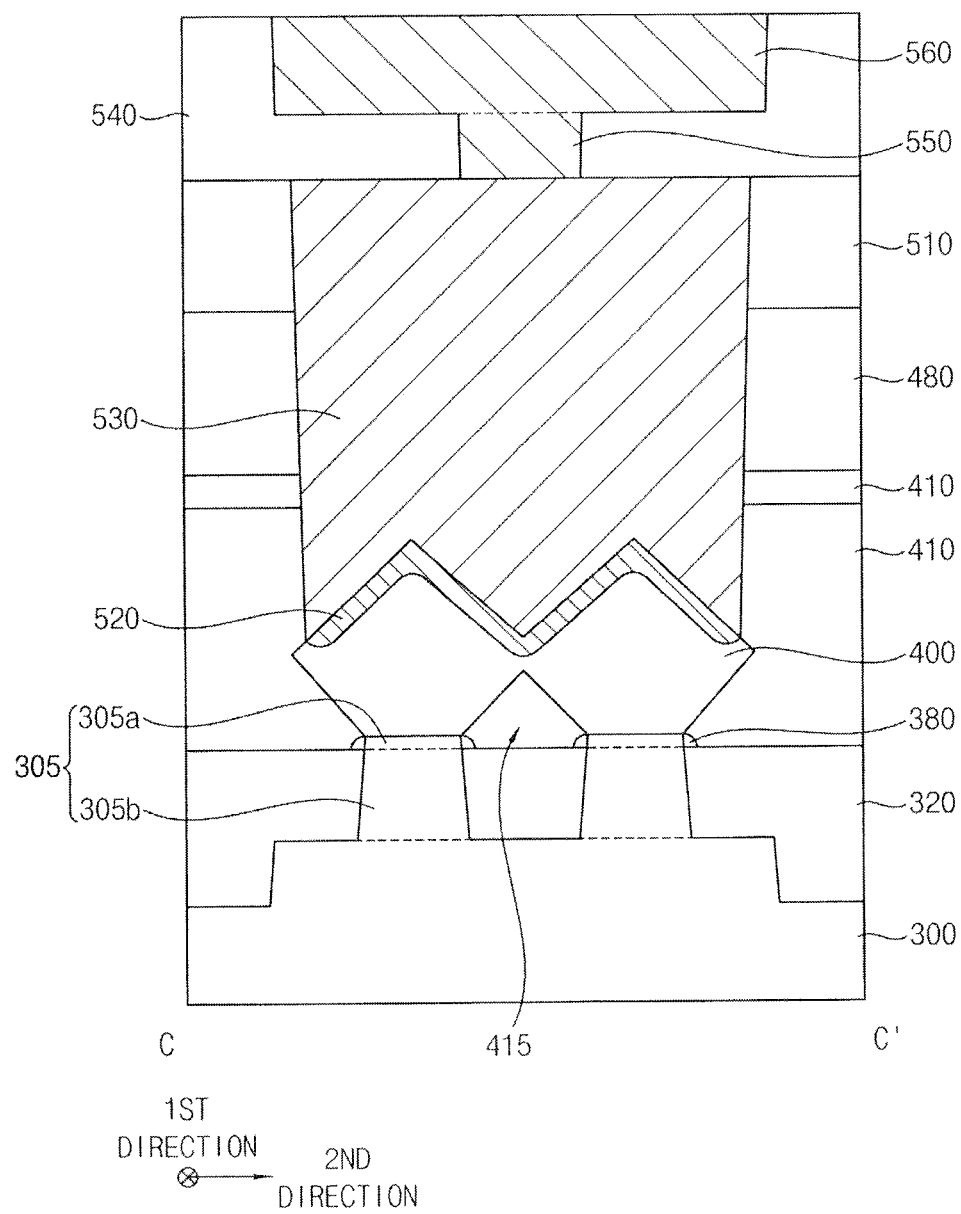

Referring to FIGS. 24 and 25, a third insulating interlayer 540 may be formed on the second insulating interlayer 510 and the lower contact plug 530, and a first conductive line 560 extending through an upper portion of the third insulating interlayer 540 and a first via 550 extending through a lower portion of the third insulating interlayer 540 may be formed.

In the present example embodiment, the first conductive line 560 and the first via 550 may be simultaneously formed by, e.g., a dual damascene process. Thus, each of the first conductive line 560 and the first via 550 may be formed to include a third conductive pattern and a third barrier pattern covering a bottom and a sidewall of the third conductive pattern. In another implementation, the first conductive line 560 and the first via 550 may be independently formed by a single damascene process.

In the present example embodiment, the first conductive line 560 may extend in a direction, and a plurality of first conductive lines 560 may be formed to be spaced apart from each other. In the present example embodiment, the first via 550 may be formed beneath the first conductive line 560 to contact an upper surface of the lower contact plug 530.

Figure 26:
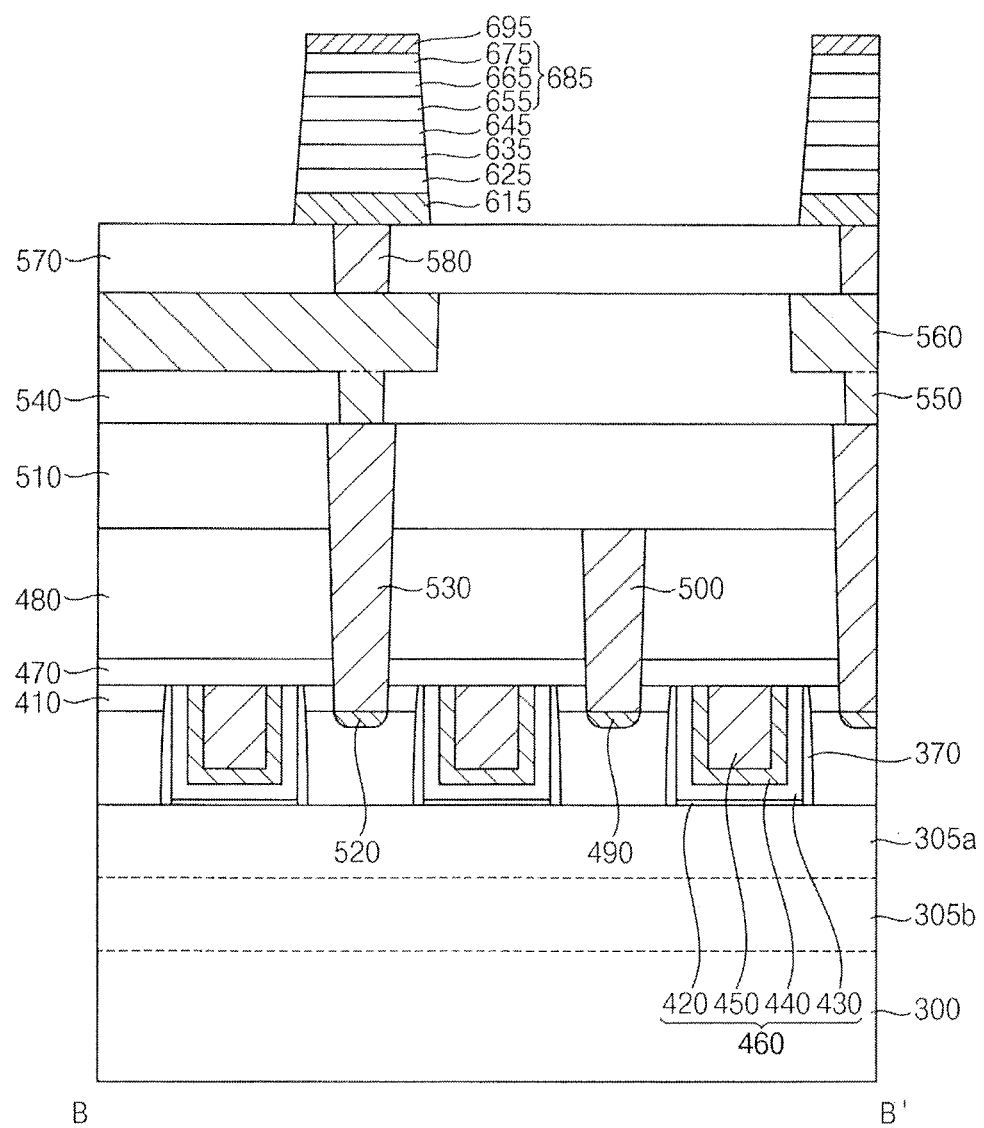
Figure 27:
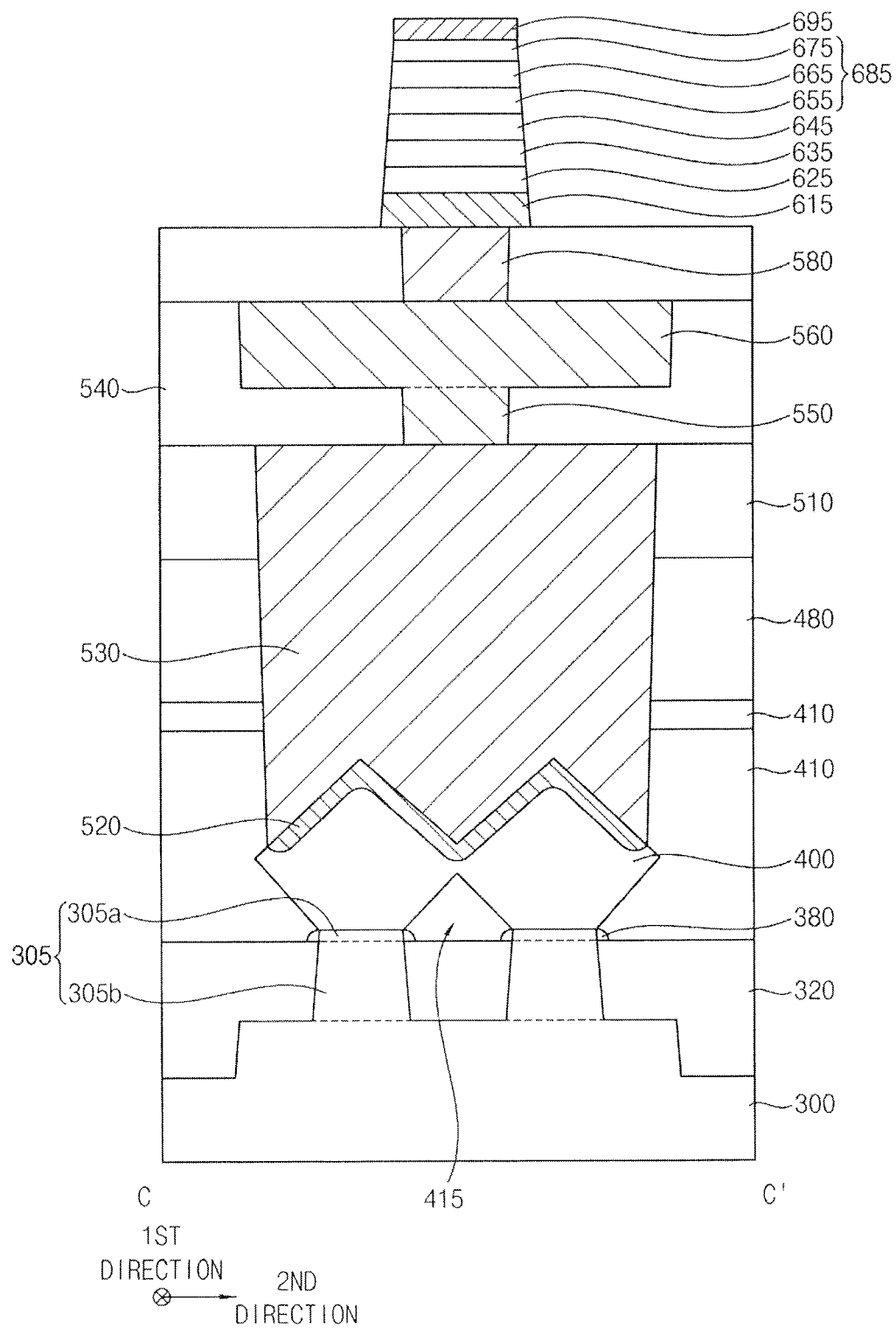
Figure 28:
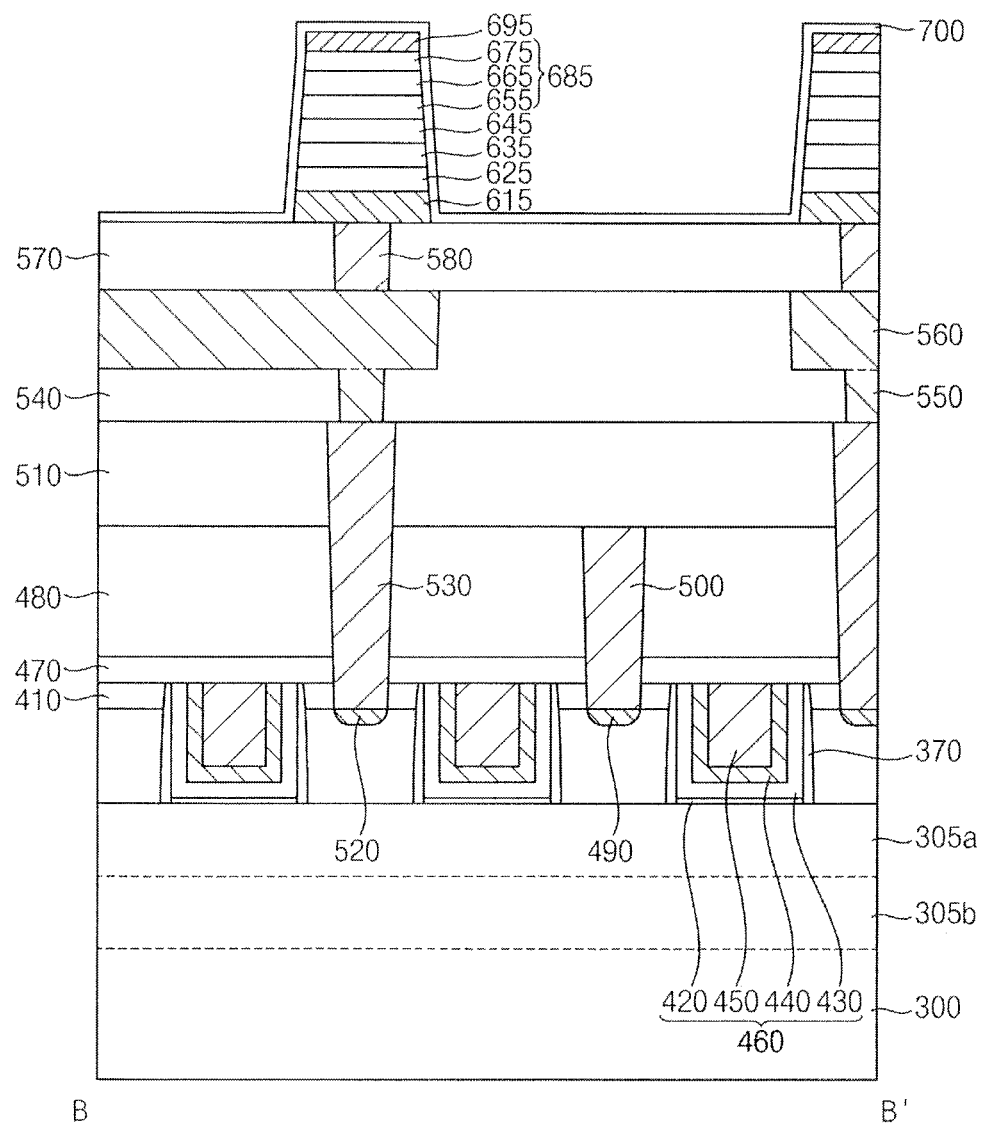

Referring to FIGS. 26 and 27, a fourth insulating interlayer 570 may be formed on the third insulating interlayer 540 and the first conductive line 560, and an upper contact plug 580 may be formed through the fourth insulating interlayer 570 to contact the first conductive lines 560. For example, the upper contact plug 580 may include a fourth conductive pattern and a fourth barrier pattern covering a bottom and a sidewall of the fourth conductive pattern.

Processes substantially the same as or similar to those illustrated with reference to FIGS. 3 and 4 may be performed.

For example, a lower electrode layer, a blocking pattern layer, an adhesion layer, a seed layer, an MTJ structure layer, and an upper electrode layer may be sequentially formed on the fourth insulating interlayer 570 and the upper contact plug 580 in deposition chambers of a first process equipment, the substrate 300 having the above structures thereon may be transferred to an etching chamber in a second process equipment, and an etching process may be performed in the etching chamber kept in a high vacuum state equal to or more than about $10^{-8}$ Torr.

Thus, a memory unit including a lower electrode 615, a blocking pattern 625, an adhesion pattern 635, a seed pattern 645, an MTJ structure 685, and an upper electrode 695 sequentially stacked may be formed on the upper contact plug 580. The MTJ structure 685 may include a fixed layer pattern 655, a tunnel barrier layer pattern 665, and a free layer pattern 675 sequentially stacked.

Processes substantially the same as or similar to those illustrated with reference to FIG. 5 may be performed.

For example, the substrate 300 having the structures thereon may be transferred to a deposition chamber kept in a high vacuum state equal to or more than about $10^{-8}$ Torr in the second process equipment through a transfer chamber in the second process equipment, and a first protection layer 700 may be formed by a deposition process to cover the memory unit. Thus, no oxide layer may be formed on a sidewall of the memory unit before forming the first protection layer 700.

Figure 29:
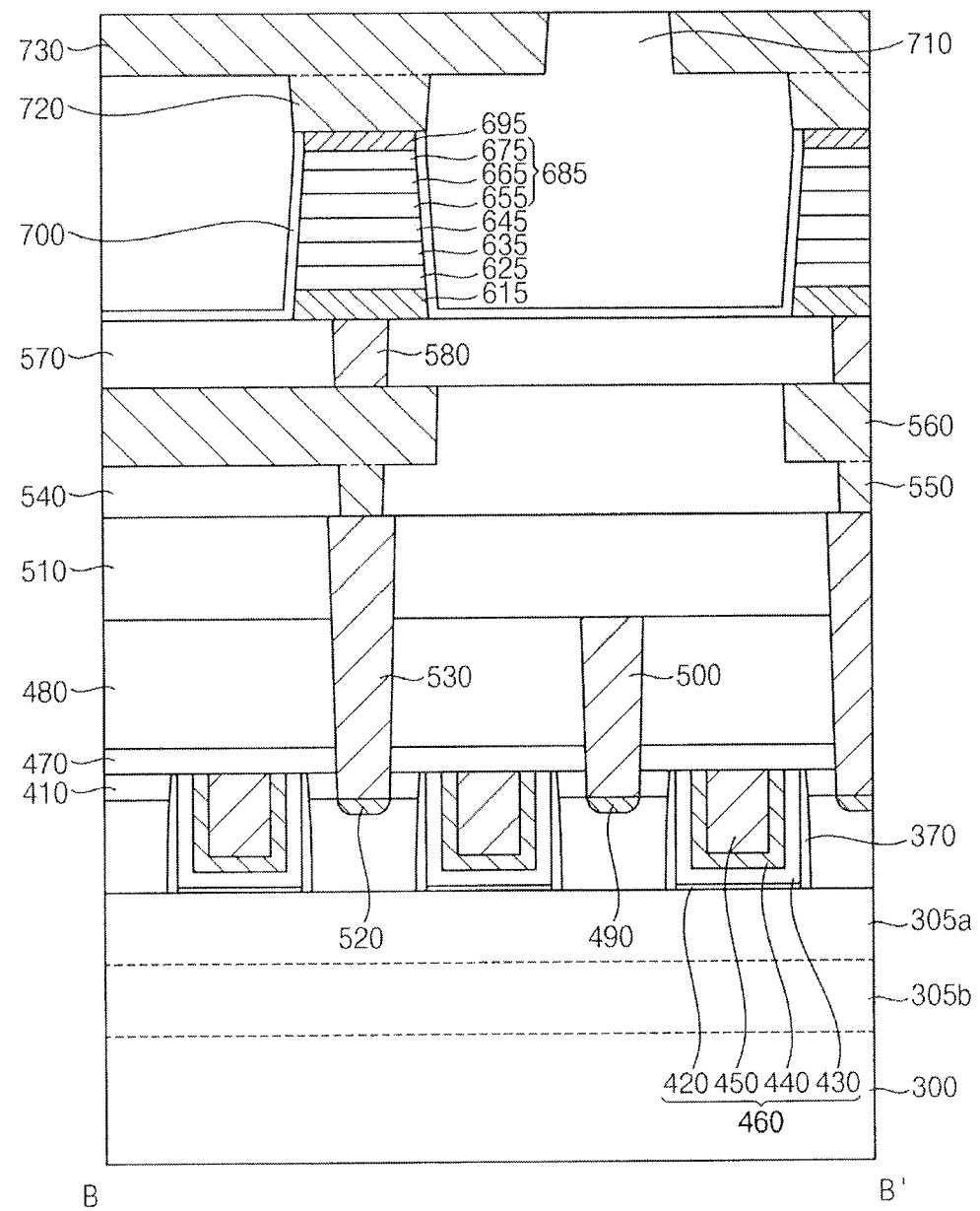
Figure 30:
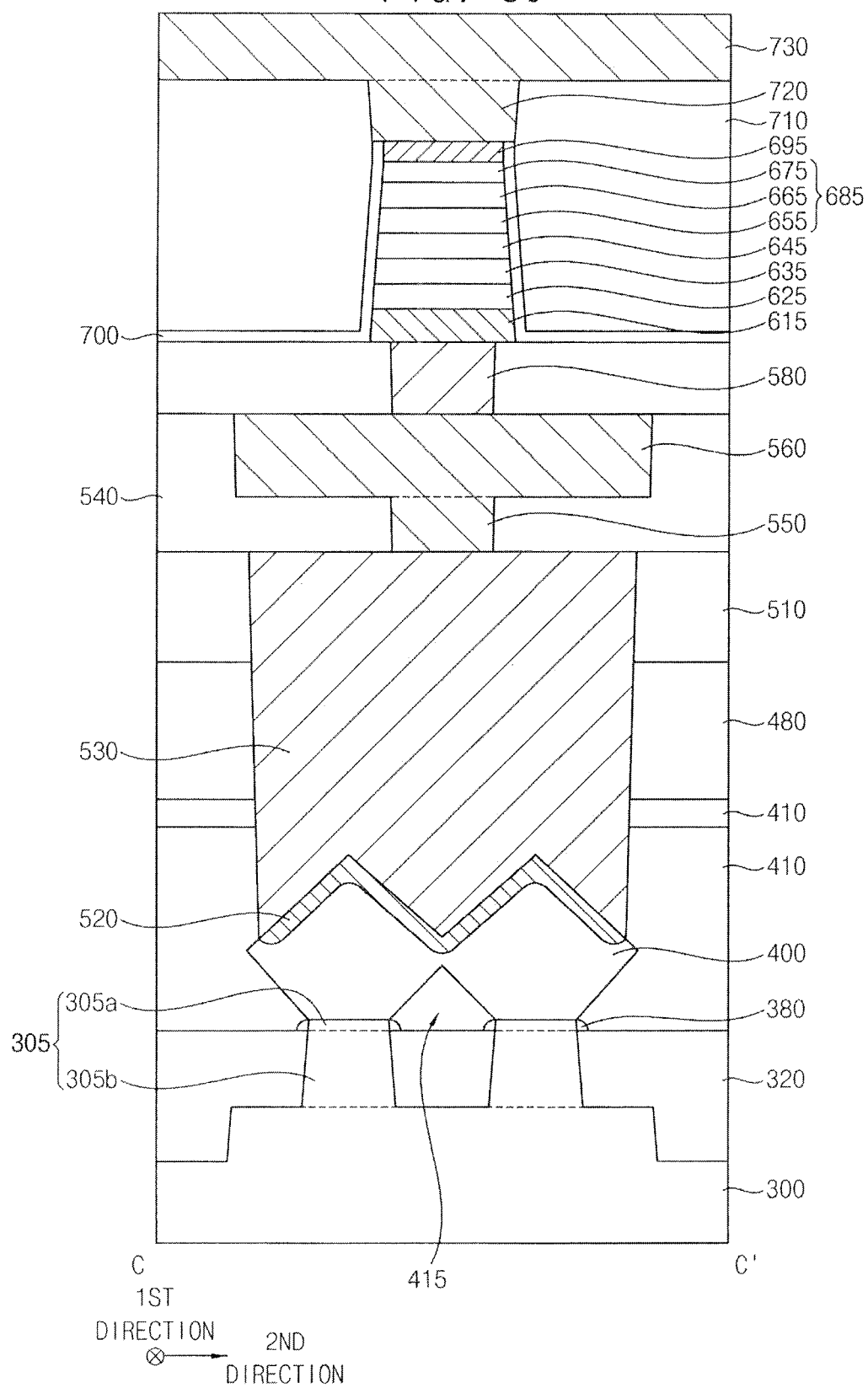

Referring to FIGS. 29 and 30, a fifth insulating interlayer 710 may be formed on the first protection layer 700, and a second via 720 and a second conductive line 730 sequentially stacked may be formed through an upper portion of the fifth insulating interlayer 710 to contact an upper surface of the upper electrode 695.

Each of the second via 720 and the second conductive line 730 may include a fifth conductive pattern and a fifth barrier pattern covering a bottom and a sidewall of the fifth conductive pattern. In the present example embodiment, the second conductive line 730 may extend in the second direction, and may serve as a bit line of the MRAM device.

FIGS. 31 to 45 are plan views and cross-sectional views illustrating stages in a method of manufacturing a variable resistance memory device in accordance with example embodiments. For example, FIGS. 31, 35, 37, 39, 41 and 43 are plan views, FIGS. 32-34, 36 and 44 are cross-sectional views taken along lines A-A' of corresponding plan views, and FIGS. 38, 40, 42 and 45 are cross-sectional views taken along lines B-B' of corresponding plan views.

This method of manufacturing the variable resistance memory device may include processes substantially the same as or similar to those illustrated with reference to FIG. 2, and a repeated description of aspects thereof may be avoided for clarity.

Figure 31:
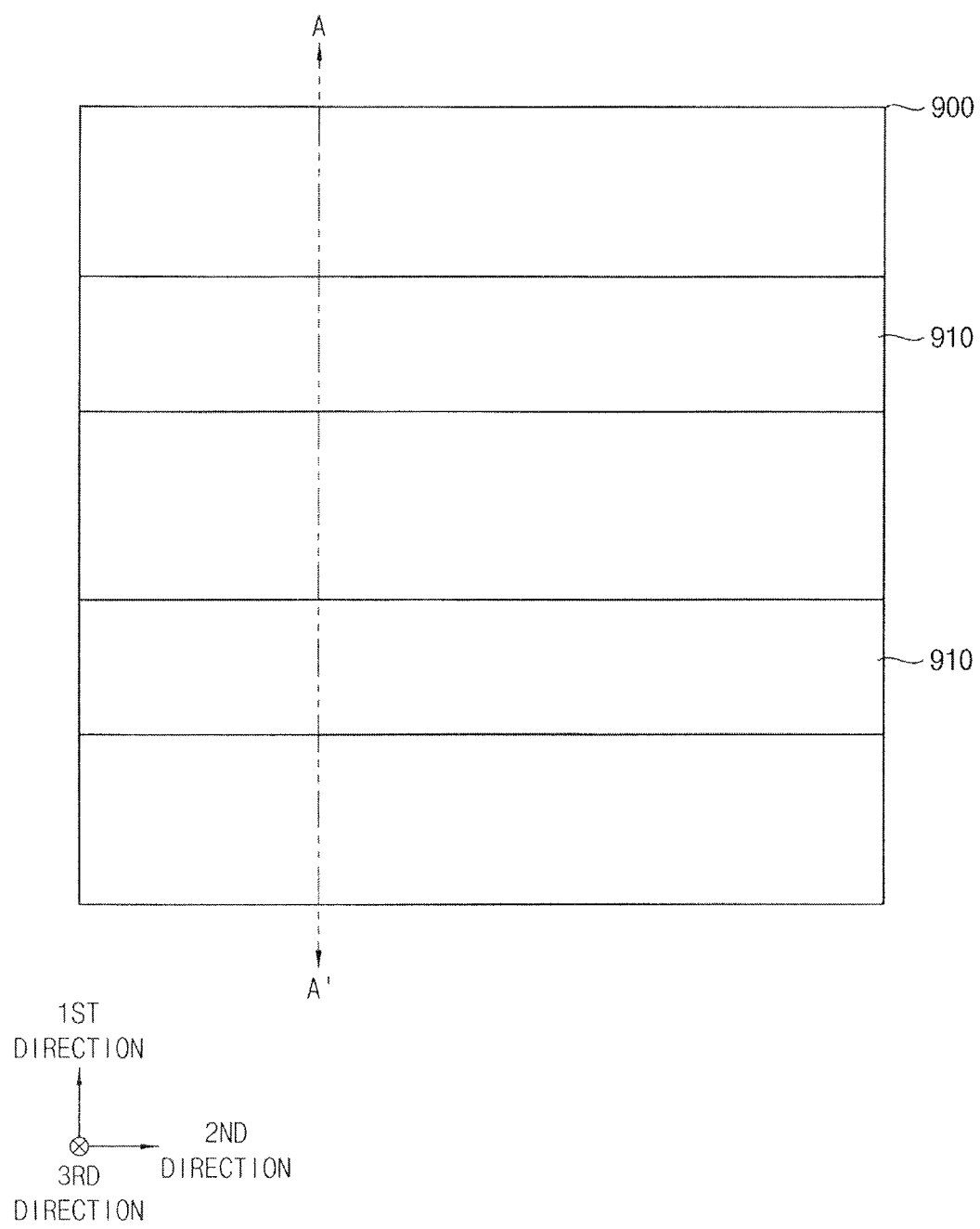
FIGS. 31 to 45 illustrate plan views and cross-sectional views of stages in a method of manufacturing a variable resistance memory device in accordance with example embodiments.
Figure 32:
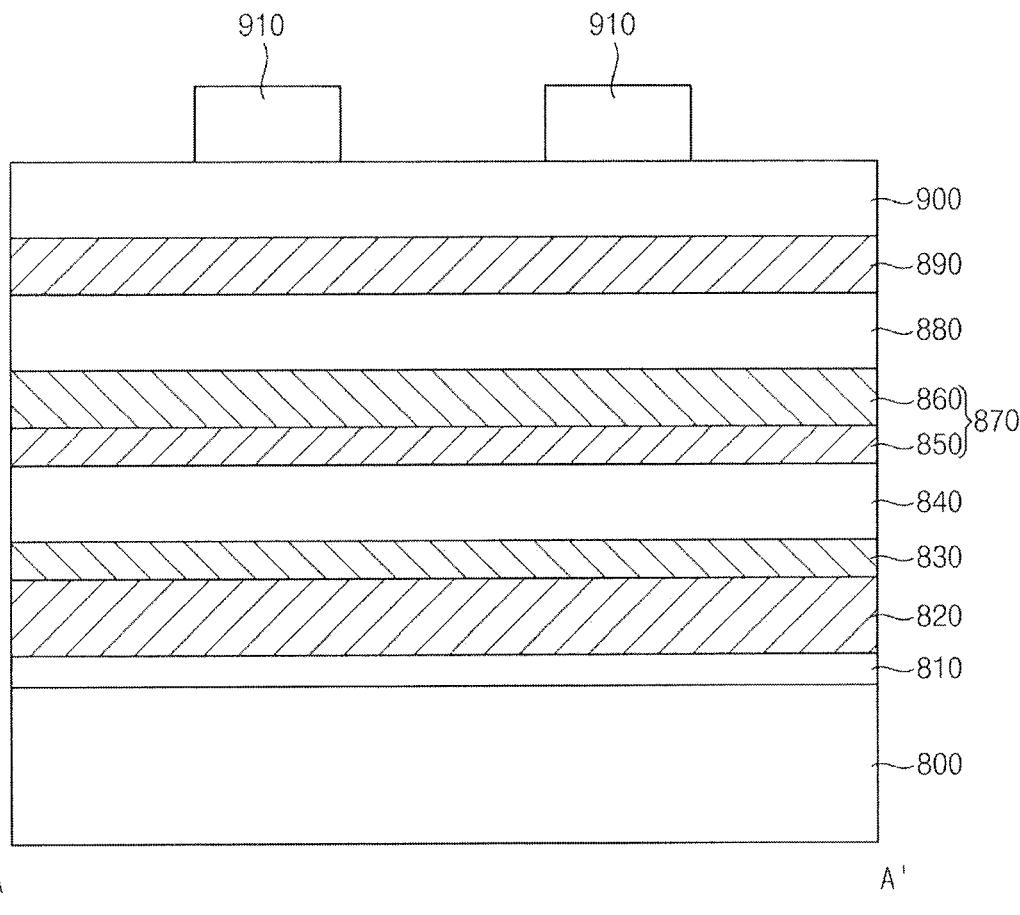

Referring to FIGS. 31 and 32, a sixth insulating interlayer 810, a sixth conductive layer 820, a first electrode layer 830, a selection layer 840, a second electrode layer structure 870, a variable resistance layer 880, a third electrode layer 890, and a second mask layer 900 may be sequentially formed on a substrate 800 in deposition chambers of a first process equipment, and a third mask 910 may be formed on the second mask layer 900.

Various types of elements, e.g., gate structures, contact plugs, wirings, etc., may be formed on the substrate 800, which may be covered by the sixth insulating interlayer 810.

The sixth conductive layer 820 may include a metal, e.g., tungsten, platinum, etc., or a metal nitride thereof. Each of the first and third electrode layers 830 and 890 may include a metal nitride, e.g., titanium nitride, tantalum nitride, etc., or a metal silicon nitride, e.g., titanium silicon nitride, tantalum silicon nitride, etc.

In the present example embodiment, the selection layer 840 may include an ovonic threshold switch (OTS) material that may serve as a switching element by the resistance difference due to the temperature difference in an amorphous state. The OTS material may include, e.g., germanium, silicon, arsenic and/or tellurium, and may further include selenium and/or sulfur.

The OTS material may include, e.g., AsTeGeSiIn, GeTe, SnTe, GeSe, SnSe, AsTeGeSiSbS, AsTeGeSiInP, AsTeGeSi, $As_2Te_3Ge$, $As_2Se_3Ge$, $As_{25}(Te_{90}Ge_{10})_{75}$, $Te_{40}As_{35}Si_{18}Ge_{6.75}In_{0.25}$, $Te_{28}As_{34.5}Ge_{15.5}S_{22})$, $Te_{39}As_{36}Si_{17}Ge_7P$, $As_{10}Te_{21}S_2Ge_{15}Se_{50}Sb_2$, $Si_5Te_{34}As_{28}Ge_{11}S_{21}Se_1$, AsTeGeSiSeNS, AsTeGeSiP, AsSe, AsGeSe, AsTeGeSe, ZnTe, GeTePb, GeSeTe, AlAsTe, SeAsGeC, SeTeGeSi, GeSbTeSe, GeBiTeSe, GeAsSbSe, GeAsBiTe, GeAsBiSe, $Ge_xSe_{1-x}$, etc.

In another implementation, the selection layer 840 may include a polysilicon layer doped with n-type impurities and a polysilicon layer doped with p-type impurities sequentially stacked, e.g., a diode.

In the present example embodiment, the second electrode layer structure 870 may include first and second layers 850 and 860. The first layer 850 may include a metal nitride, e.g., titanium nitride, tantalum nitride, etc., or a metal silicon nitride. e.g., titanium silicon nitride, tantalum silicon nitride, etc., as the first and third electrode layers 830 and 890, which may be also referred to as a second electrode layer. The second layer 860 may include carbon or a metal containing carbon. For example, the second layer 860 may include carbon, carbonitride, titanium carbonitride, etc. The second layer 860 may be referred to as a heater layer.

In the present example embodiment, the variable resistance layer 880 may include a material whose resistance may be changed according to the phase change thereof. In this case, the variable resistance memory device may be a phase-change random access memory (PRAM) device. In an example embodiment, the variable resistance layer 880 may include, e.g., a chalcogenide material containing germanium, antimony and/or tellurium. In an example embodiment, the variable resistance layer 880 may include a super lattice having a germanium-tellurium layer and an antimony-tellurium layer alternately stacked. In an example embodiment, the variable resistance layer 880 may include IST containing indium-antimony-tellurium or BST containing bismuth-antimony-tellurium.

In the present example embodiment, the variable resistance layer 880 may include, e.g., a perovskite-based material or a transition metal oxide. In this case, the variable resistance memory device may be a resistive random access memory (ReRAM) device. The perovskite-based material may include, e.g., STO ($SrTiO_3$), BTO ($BaTiO_3$), PCMO ($Pr_{1-x}Ca_xMnO_3$) or the like. The transition metal oxide may include titanium oxide ($TiO_x$), zirconium oxide ($ZrO_x$), aluminum oxide ($AlO_x$), etc. These may be used alone or in combination.

The second mask layer 900 may include a nitride, e.g., silicon nitride, and the third mask 910 may include an oxide, e.g., silicon oxide.

In the present example embodiment, the third mask 910 may extend in the second direction, and a plurality of third masks 910 may be formed in the first direction.

Figure 33:
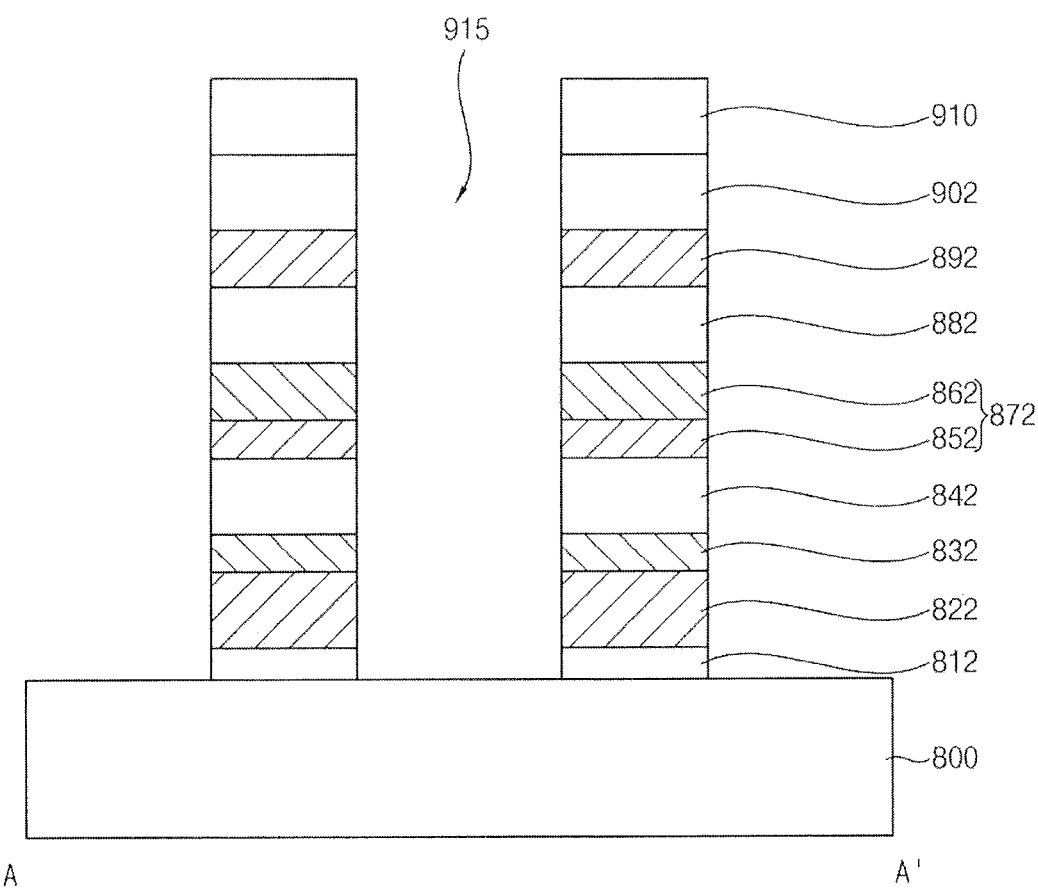

Referring to FIG. 33, the substrate 800 having the above structures thereon may be transferred to an etching chamber of a second process equipment, and an etching process may be performed in the etching chamber kept in a high vacuum state equal to or more than about $10^{-8}$ Torr.

For example, the second mask layer 900 may be etched using the third mask 910 as an etching mask, and the third electrode layer 890, the variable resistance layer 880, the second electrode layer structure 870, the selection layer 840, the first electrode layer 830, the first conductive layer 820, and the sixth insulating interlayer 810 may be sequentially etched using the second and third masks 902 and 910 as an etching mask to form a preliminary third electrode 892, a preliminary variable resistance pattern 882, a preliminary second electrode structure 872, a preliminary selection pattern 842, a preliminary first electrode 832, a sixth conductive line 822, and a sixth insulating interlayer pattern 812, respectively. During the etching process, the third mask 910 may be completely removed or a portion of the third mask 910 may remain.

Thus, a first structure including the sixth insulating interlayer pattern 812, the sixth conductive line 822, the preliminary first electrode 832, the preliminary selection pattern 842, the preliminary second electrode structure 872, the preliminary variable resistance pattern 882, the preliminary third electrode 892, the second mask 902, and the third mask 910 sequentially stacked may be formed. The first structure may extend in the second direction, and a plurality of first structures may be formed in the first direction. A space between the plurality of first structures may be referred to as a fourth opening 915.

The preliminary second electrode structure 872 may include a preliminary first pattern 852 and a preliminary second pattern 862 sequentially stacked, and may be referred to as a preliminary second electrode 852 and a preliminary heater 862, respectively.

Figure 34:
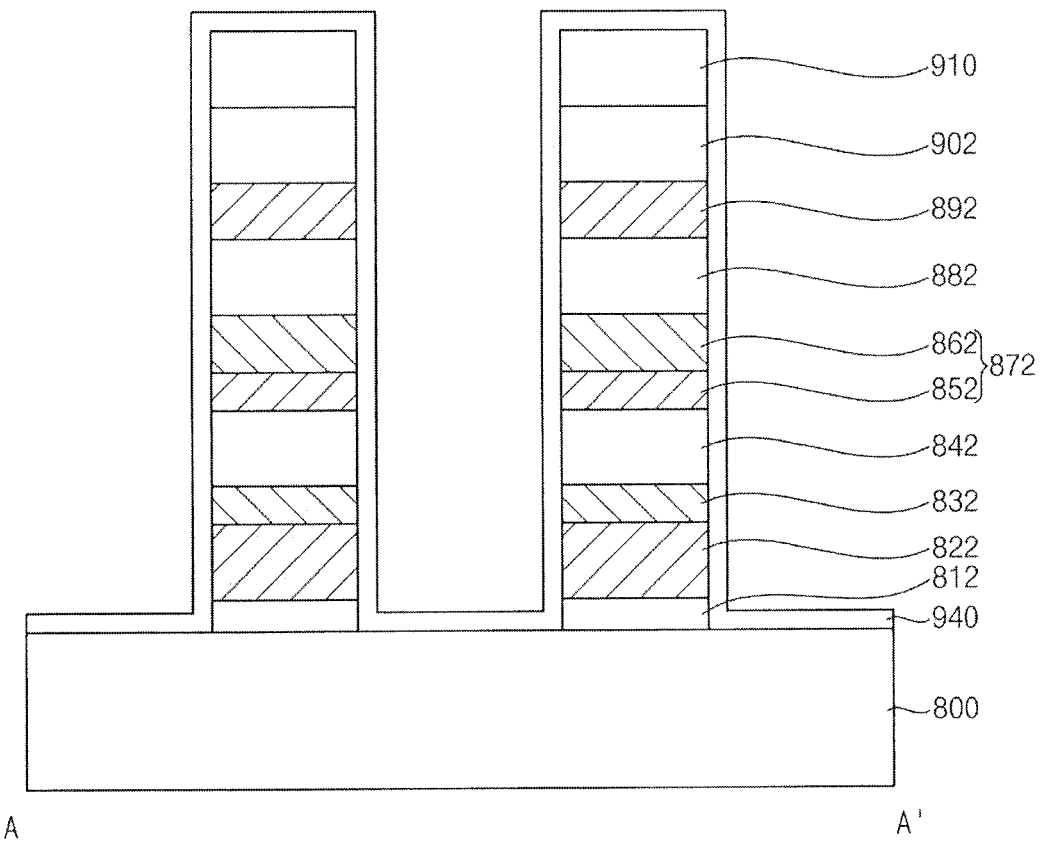

Referring to FIG. 34, the substrate 800 having the first structure thereon may be transferred to a deposition chamber in the second process equipment through a transfer chamber in the second process equipment, and a second protection layer 940 may be formed on the substrate 800 to cover the first structure.

In the present example embodiment, the transfer chamber and the deposition chamber may be kept in a high vacuum state equal to or more than about $10^{-8}$ Torr, as the etching chamber. For example, the etching process and the deposition process may be performed in-situ in the same second process equipment, and the substrate 800 having the first structure thereon may be kept in a high vacuum state equal to or more than about $10^{-8}$ Torr during the etching process, during the deposition process, and between the etching process and the deposition process. Thus, no oxide layer may be formed on a sidewall of the first structure before forming the second protection layer 940.

The second protection layer 940 may include a nitride, e.g., silicon nitride.

Figure 35:
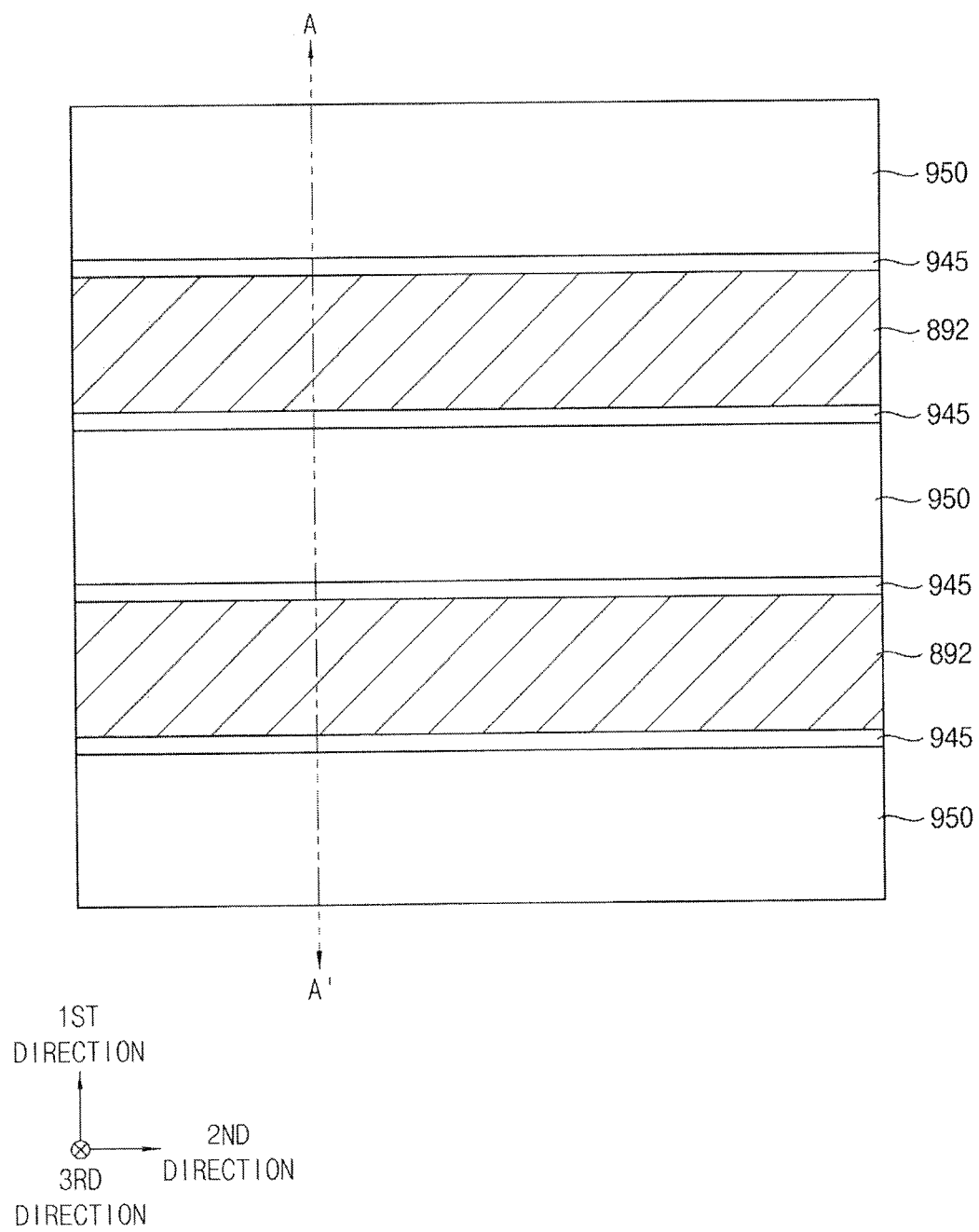
Figure 36:
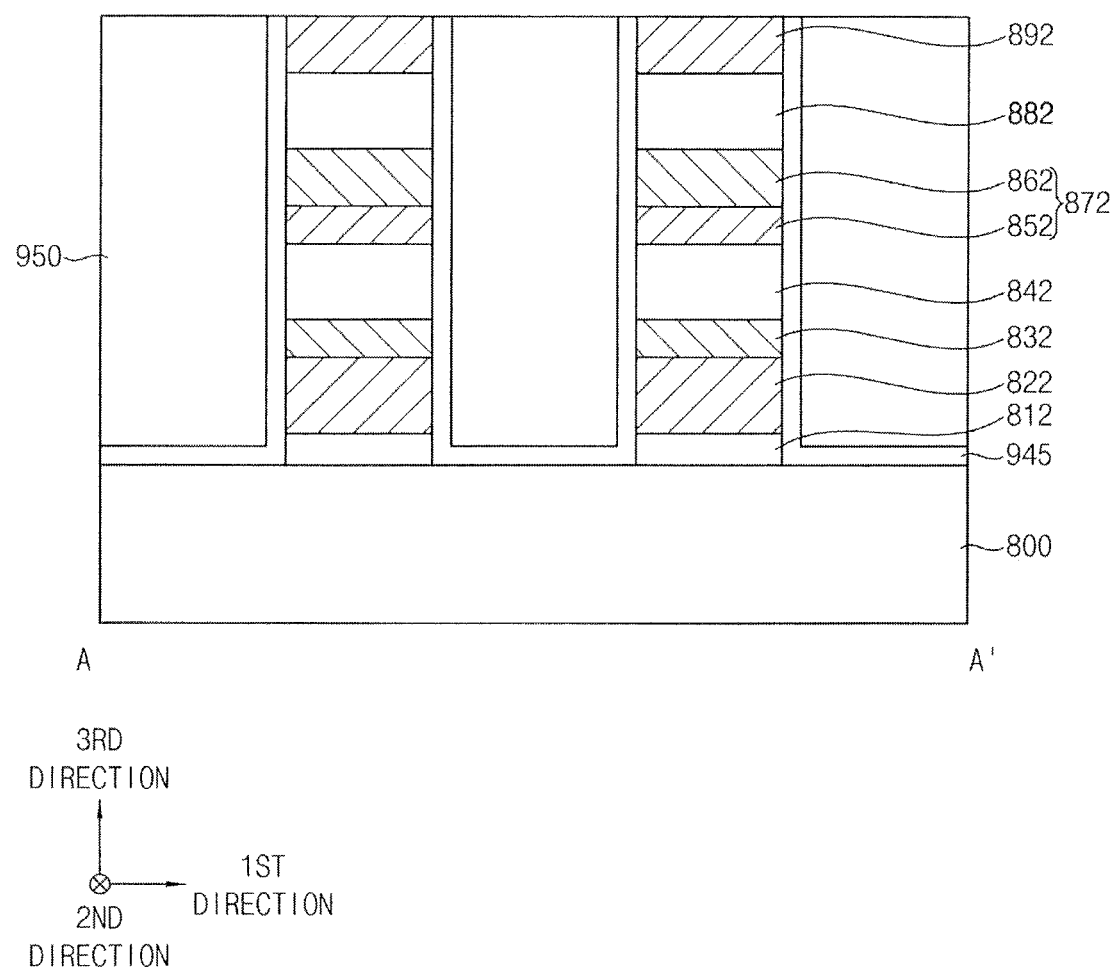

Referring to FIGS. 35 and 36, a seventh insulating interlayer 950 may be formed on the second protection layer 940 to fill a remaining portion of the fourth opening 915, and upper portions of the first structure, the second protection layer 940, and the seventh insulating interlayer 950 may be planarized until an upper surface of the preliminary third electrode 892.

Thus, the second and third masks 902 and 910 of the first structure may be removed to form a second structure, and the second protection layer 940 and the seventh insulating interlayer 950 may be transformed into a second protection pattern 945 and a seventh insulating interlayer pattern 955, respectively. The second protection pattern 945 may extend in the second direction, and may cover a sidewall of the second structure and an upper surface of the substrate 800.

Figure 37:
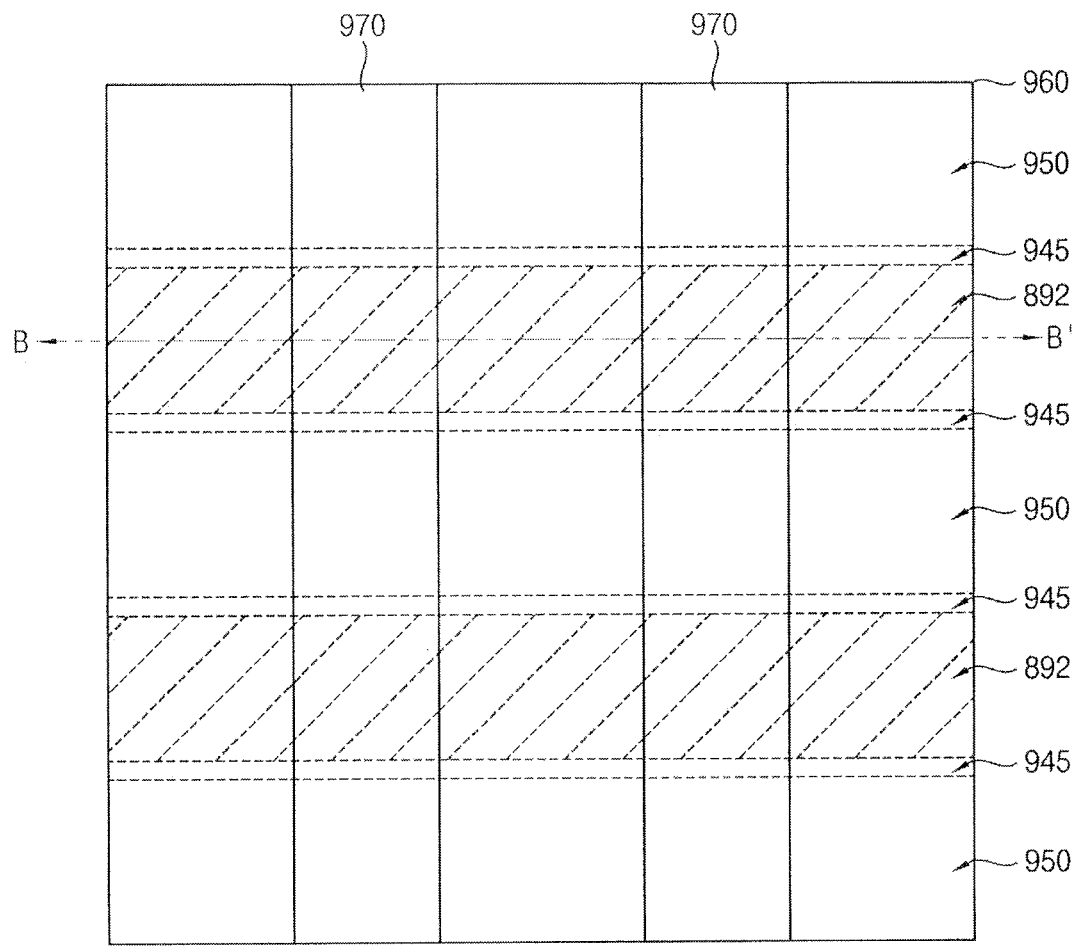
Figure 38:
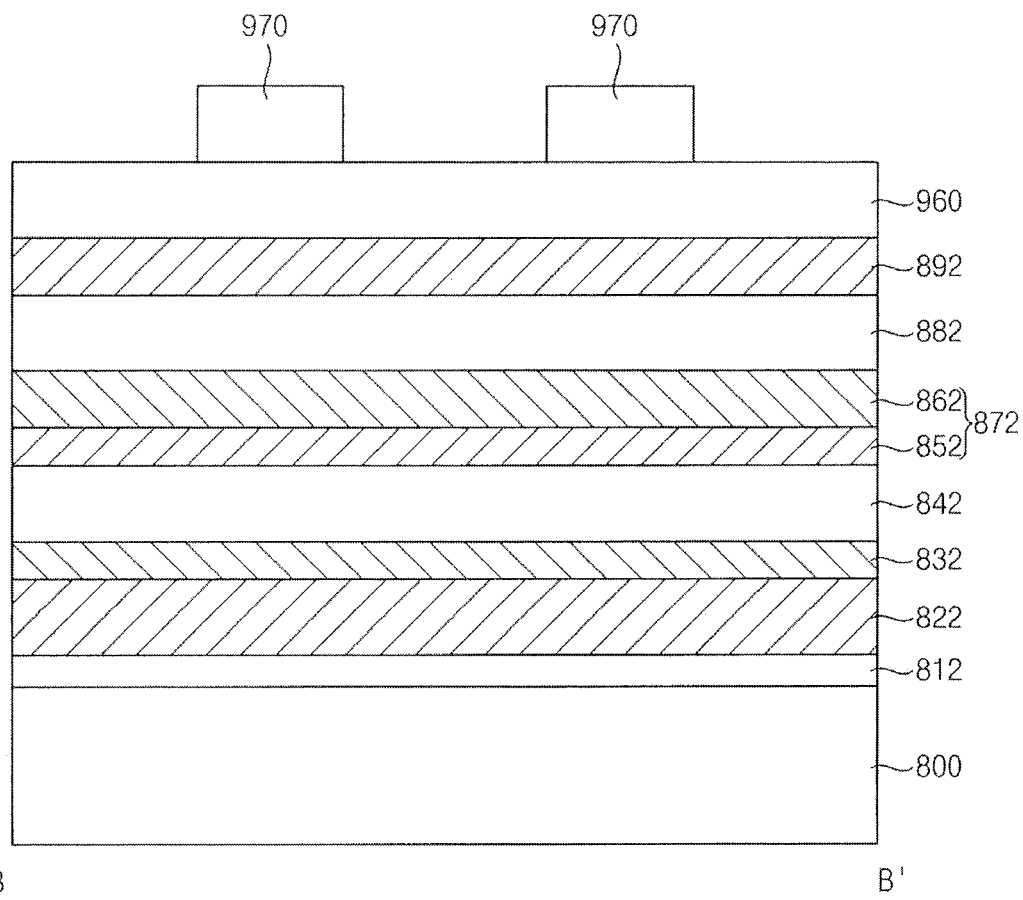
Figure 38:
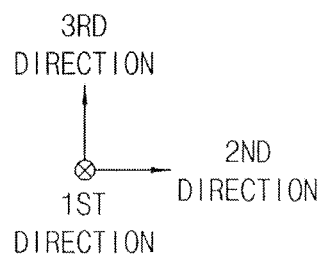

Referring to FIGS. 37 and 38, a fourth mask layer 960 may be formed on the second structure, the second protection pattern 945, and the seventh insulating interlayer pattern 955, and a fifth mask 970 may be formed on the fourth mask layer 960.

In the present example embodiment, the fifth mask 970 may extend in the first direction, and a plurality of fifth masks 970 may be formed in the second direction.

Figure 39:
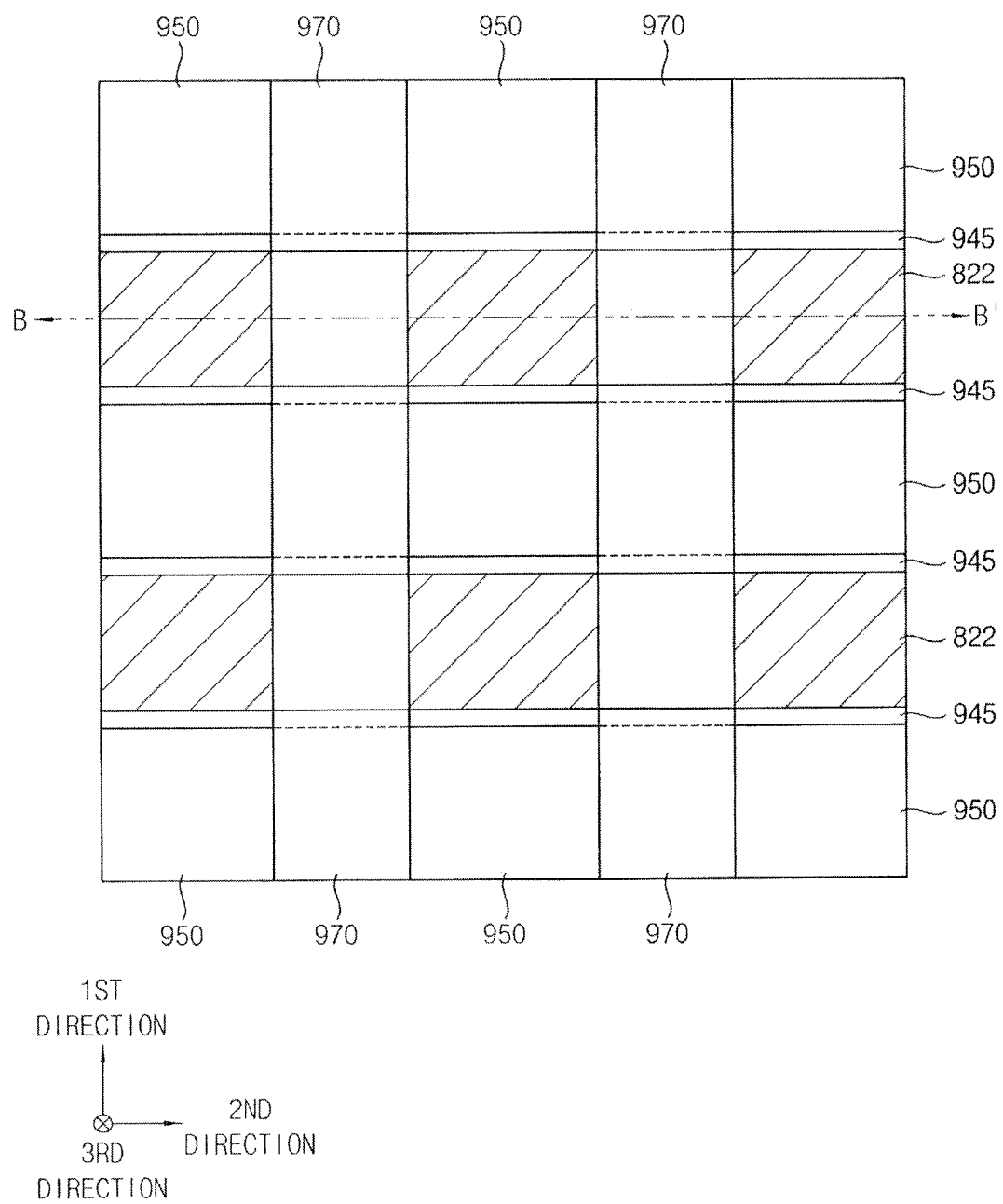
Figure 40:
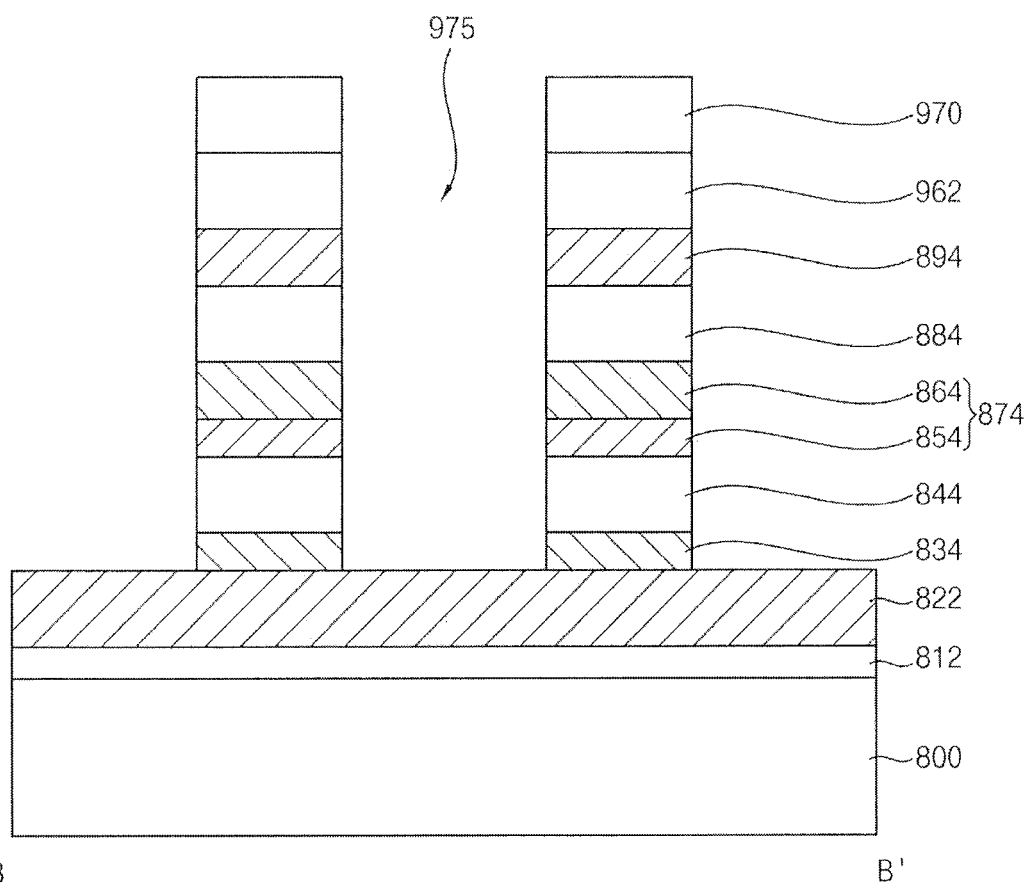

Referring to FIGS. 39 and 40, processes substantially the same as or similar to those illustrated with reference to FIG. 33 may be performed. For example, the substrate 800 having the structures may be transferred to the etching chamber of the second process equipment, and an etching process may be performed in the etching chamber kept in a high vacuum state equal to or more than about $10^{-8}$ Torr.

For example, the fourth mask layer 960 may be etched using the fifth mask 970 as an etching mask to form a fourth mask 962 extending in the first direction, and the preliminary third electrode 892, the preliminary variable resistance pattern 882, the preliminary second electrode structure 872, the preliminary selection pattern 842, and the preliminary first electrode 832 may be sequentially etched using the fourth and fifth masks 962 and 970 as an etching mask to form a third electrode 894, a variable resistance pattern 884, a second electrode structure 874, a selection pattern 844, and a first electrode 834, respectively. The fifth mask 970 may be completely removed, or a portion of the fifth mask 970 may remain. Upper portions of the second protection pattern 945 and the seventh insulating interlayer pattern 955 may be also removed so that heights of upper surfaces of the second protection pattern 945 and the seventh insulating interlayer pattern 955 may become substantially coplanar with that of an upper surface of the sixth conductive line 822.

Thus, a third structure including the first electrode 834, the selection pattern 844, the second electrode structure 874, the variable resistance pattern 884, the third electrode 894, the fourth mask 962, and the fifth mask 970 sequentially stacked may be formed on the sixth conductive line 822. A plurality of third structures may be formed on the sixth conductive line 822 in the second direction. A space between the third structures may be referred to as a fifth opening 975.

The second electrode structure 874 may include first and second patterns 854 and 864 sequentially stacked, which may be referred to as a second electrode 854 and a heater 864, respectively.

Figure 41:
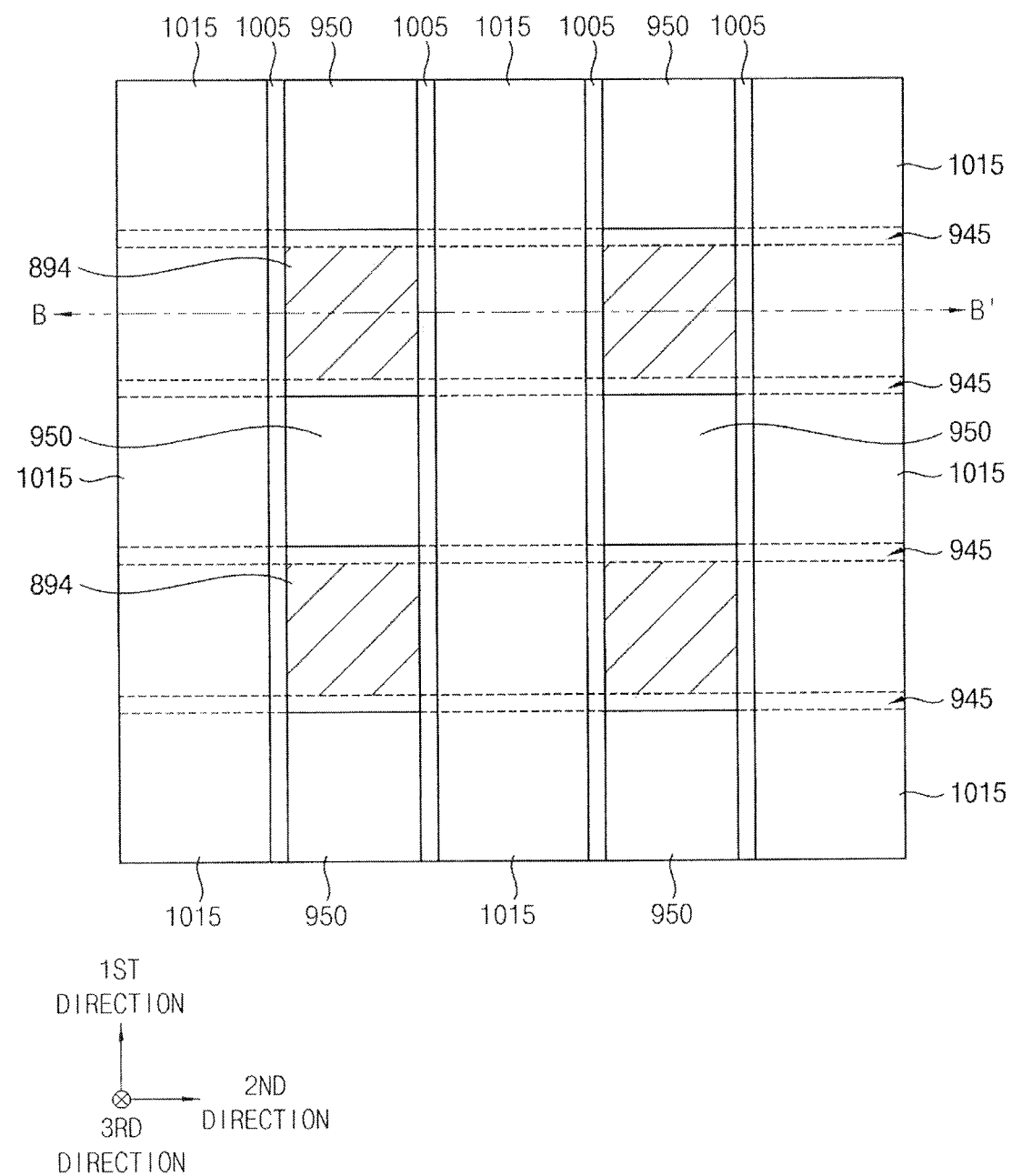
Figure 42:
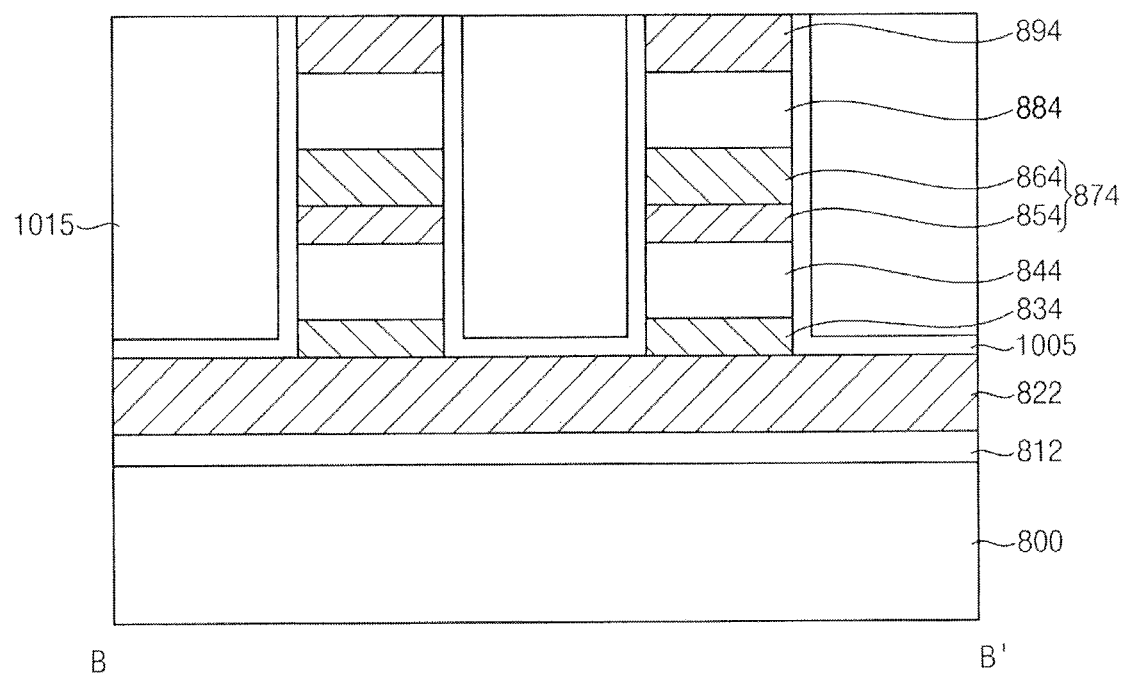

Referring to FIGS. 41 and 42, processes substantially the same as or similar to those illustrated with reference to FIGS. 34 to 36 may be performed.

For example, after the substrate 800 having the third structure thereon is transferred to the deposition chamber in the second process equipment through the transfer chamber in the second process equipment, a deposition process may be performed to form a third protection layer covering the third structure on the sixth conductive line 822, the second protection pattern 945, and the seventh insulating interlayer pattern 955, and an eighth insulating interlayer may be formed on the third protection layer to fill a remaining portion of the fifth opening 975.

Upper portions of the third structure, the third protection layer, and the eighth insulating interlayer may be planarized until an upper surface of the third electrode 894 may be exposed so that the fourth and fifth masks 962 and 970 of the third structure may be removed to form a memory unit, and the third protection layer and the eighth insulating interlayer may be transformed into a third protection pattern 1005 and an eighth insulating interlayer pattern 1015, respectively. The second protection pattern 945 and the seventh insulating interlayer pattern 955 under the fourth and fifth masks 962 and 970 may be exposed.

The third protection pattern 1005 may extend in the first direction, and may cover a sidewall of the memory unit, the sixth conductive line 822, the second protection pattern 945, and the seventh insulating interlayer pattern 955.

Figure 43:
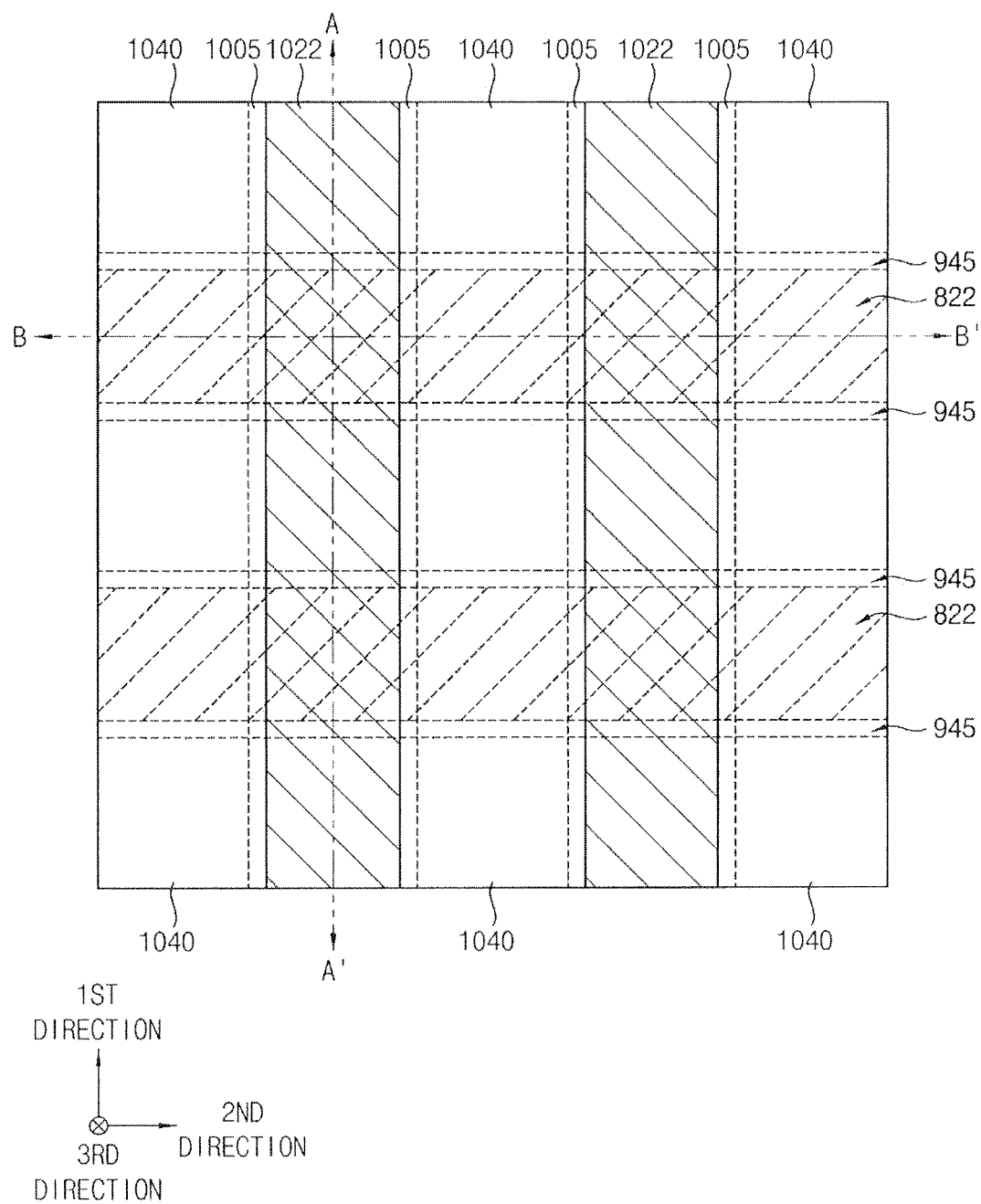
Figure 44:
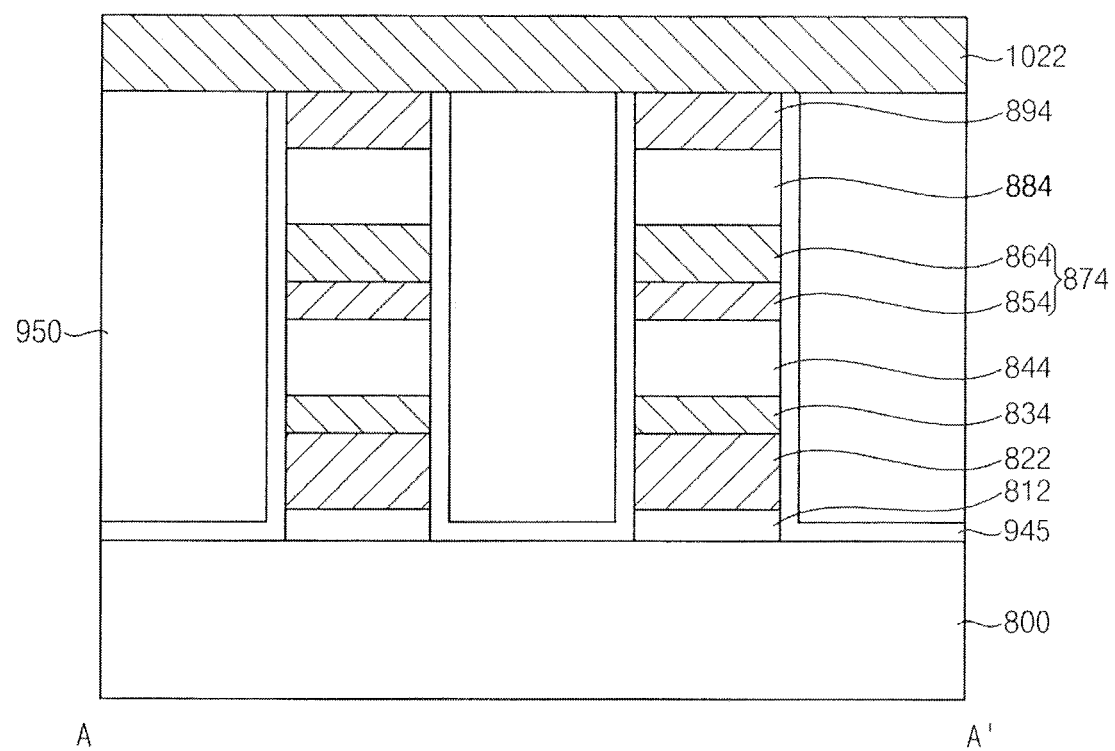
Figure 45:
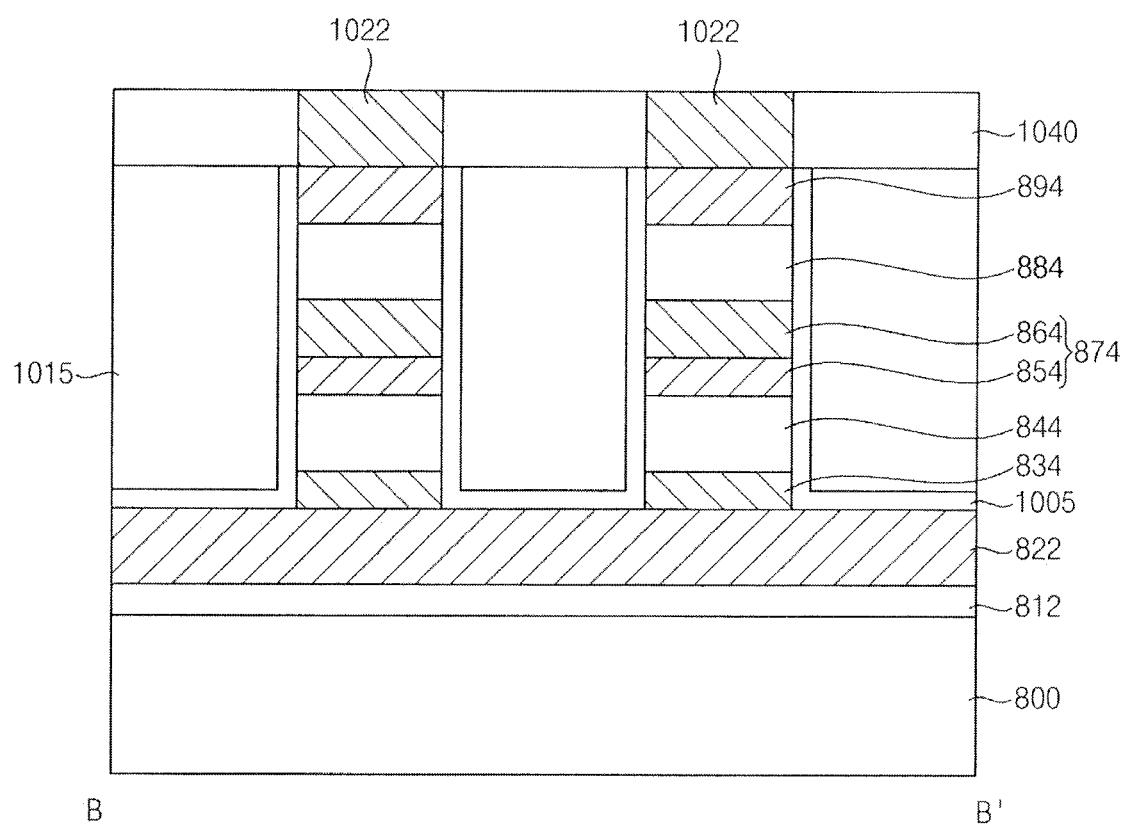
Figure 45:
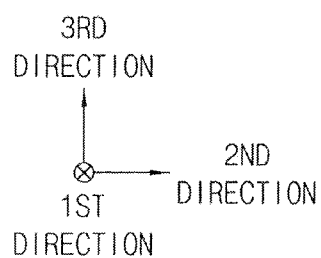

Referring to FIGS. 43 to 45, a seventh conductive line 1022 may be formed on the memory unit, the second protection pattern 945, and the seventh insulating interlayer pattern 955 to extend in the first direction, and a ninth insulating interlayer pattern 1040 may be formed on the third protection pattern 1005 and the eighth insulating interlayer pattern 1015 to cover a sidewall of the seventh conductive line 1022.

In the present example embodiment, the seventh conductive line 1022 may be formed by forming a seventh conductive layer on the memory unit, the second protection pattern 945, the seventh insulating interlayer pattern 955, the third protection pattern 1005, and the eighth insulating interlayer pattern 1015, and patterning the seventh conductive layer through an etching process using an etching mask extending in the first direction. The ninth insulating interlayer pattern 1040 may be formed by forming a ninth insulating interlayer on the third protection pattern 1005 and the eighth insulating interlayer pattern 1015 to cover the seventh conductive line 1022, and planarizing the ninth insulating interlayer until an upper surface of the seventh conductive line 1022 may be exposed.

The seventh conductive layer may include a metal, e.g., tungsten, platinum, etc., or a metal nitride thereof.

As described above, the etching process for forming the memory unit including the variable resistance pattern 884 on the substrate 800, and the deposition process for forming the second and third protection patterns 945 and 1005 on the sidewall of the memory unit may be performed in-situ in the second process equipment, and for example may be performed in the etching chamber and the deposition chamber kept in the high vacuum state of more than about $10^{-8}$ Torr. The substrate 800 having the memory unit may be transferred to the etching chamber and the deposition chamber through the transfer chamber kept in the high vacuum state of more than about $10^{-8}$ Torr. Accordingly, no oxide layer may be formed on the sidewall of the memory unit before forming the second and third protection patterns 945 and 1005, and the memory unit may have improved retention.

By way of summation and review, when a variable resistance memory device is formed, after a lower electrode layer, a variable resistance layer, and an upper electrode layer are sequentially formed and etched to form a lower electrode, a variable resistance pattern, and an upper electrode, respectively, a protection layer may be formed to cover the lower electrode, the variable resistance pattern, and the upper electrode. If the etching process and the formation process for the protection layer are not performed in the same chamber, the variable resistance pattern and the lower and upper electrodes may be exposed to be oxidized.

As described above, example embodiments relate to a method of manufacturing a variable resistance memory device. Example embodiments may provide a method of manufacturing a variable resistance memory device having improved characteristics.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of manufacturing a variable resistance memory device, the method comprising:
    forming a magnetic tunnel junction (MTJ) structure layer on a substrate;
    prior to forming the MTJ structure layer, forming a lower electrode layer on the substrate;
    after forming the MTJ structure layer, forming an upper electrode layer on the MTJ structure layer,
    etching the MTJ structure layer in an etching chamber to form an MTJ structure;
    transferring the substrate having the MTJ structure thereon to a deposition chamber through a transfer chamber; and
    forming a protection layer covering a sidewall of the MTJ structure in the deposition chamber,
    wherein the substrate is maintained in a high vacuum state during the etching of the MTJ structure layer in the etching chamber, the forming of the protection layer in the deposition chamber, and the transferring of the substrate between the etching chamber and the deposition chamber, and
    wherein etching the MTJ structure layer includes etching the upper and lower electrode layers to form upper and lower electrodes, respectively, so that the protection layer further covers sidewalls of the upper and lower electrodes.

2. The method as claimed in claim 1, wherein the etching chamber, the transfer chamber, and the deposition chamber are disposed in a same process equipment, and etching the MTJ structure layer and forming the protection layer are performed in-situ in the same process equipment.

3. The method as claimed in claim 1, wherein etching the MTJ structure layer is performed by an ion beam etching process or a reactive ion etching process.

4. The method as claimed in claim 1, wherein forming the protection layer is performed by a chemical vapor deposition process, a physical vapor deposition process, or an atomic layer deposition process.

5. The method as claimed in claim 1, wherein the protection layer includes silicon nitride, aluminum nitride, or aluminum oxide.

6. The method as claimed in claim 1, wherein the lower electrode includes a metal nitride, and the upper electrode includes a metal or a metal nitride.

7. The method as claimed in claim 1, further comprising, after forming the lower electrode layer on the substrate, sequentially forming a blocking layer, an adhesion layer, and a seed layer on the lower electrode layer,
    wherein etching the MTJ structure layer further includes etching the blocking layer, the adhesion layer, and the seed layer to form a blocking pattern, an adhesion pattern, and a seed pattern, respectively, and the protection layer further covers sidewalls of the blocking pattern, the adhesion pattern, and the seed pattern.

8. The method as claimed in claim 1, wherein the MTJ structure includes a fixed layer pattern, a tunnel barrier pattern, and a free layer pattern sequentially stacked.

9. A method of manufacturing a variable resistance memory device, the method comprising:
    forming a memory unit layer including a first electrode layer, a selection layer, a second electrode structure layer, a variable resistance layer, and a third electrode layer sequentially stacked on a substrate;
    etching the memory unit layer in an etching chamber to form a memory unit including a variable resistance pattern, the etching of the memory unit layer including etching the first electrode layer, the selection layer, the second electrode structure layer, the variable resistance layer, and the third electrode layer to form a first electrode, a selection pattern, a second electrode structure, a variable resistance pattern, and a third electrode, respectively;
    transferring the substrate having the memory unit thereon to a deposition chamber through a transfer chamber; and
    forming a protection layer covering at least a sidewall of the variable resistance pattern in the deposition chamber,
    wherein the substrate is maintained in a high vacuum state during the etching of the memory unit layer in the etching chamber and the transferring of the substrate between the etching chamber and the deposition chamber.

10. The method as claimed in claim 9, wherein the etching chamber, the transfer chamber, and the deposition chamber are disposed in a same process equipment, and etching the memory unit layer and forming the protection layer are performed in-situ in the process equipment.

11. The method as claimed in claim 9, wherein the protection layer covers a sidewall of the entire memory unit.

12. The method as claimed in claim 9, wherein the first and third electrodes include a metal nitride or a metal silicon nitride, the second electrode structure includes carbon or a metal carbide, and the selection pattern includes an ovonic threshold switch material.

13. The method as claimed in claim 12, wherein the second electrode structure includes:
    a first pattern including a metal nitride or a metal silicon nitride; and
    a second pattern on the first pattern, the second pattern including carbon or a metal carbide.

14. The method as claimed in claim 9, wherein the protection layer includes silicon nitride, aluminum nitride, or aluminum oxide.

15. A method of manufacturing a variable resistance memory device, the method comprising:
    sequentially forming a lower electrode layer, a magnetic tunnel junction (MTJ) structure layer, and an upper electrode layer on a substrate;
    performing an etching process in a high vacuum state equal to or less than about $10^{-8}$ Torr to etch the upper electrode layer, the MTJ structure layer, and the lower electrode layer to form an upper electrode, an MTJ structure, and a lower electrode, respectively; and
    performing a deposition process in a high vacuum state equal to or less than about $10^{-8}$ Torr to form a protection layer covering sidewalls of the upper electrode, the MTJ structure, and the lower electrode,
    wherein the etching process and the deposition process are performed in-situ in a same process equipment, and wherein the substrate having the upper electrode, the MTJ structure, and the lower electrode thereon is kept in a high vacuum state equal to or less than about $10^{-8}$ Torr between the etching process and the deposition process.

16. The method as claimed in claim 15, wherein:

the etching process and the deposition process are performed in an etching chamber and a deposition chamber, respectively, in the process equipment, and the substrate having the upper electrode, the MTJ structure, and the lower electrode thereon stays in a transfer chamber connected to the etching chamber and the deposition chamber between the etching process and the deposition process.

17. The method as claimed in claim 15, wherein the protection layer includes silicon nitride, aluminum nitride, or aluminum oxide.

18. The method as claimed in claim 15, further comprising sequentially forming a blocking layer, an adhesion layer, and a seed layer between the lower electrode layer and the MTJ structure layer, wherein the etching process further includes etching the blocking layer, the adhesion layer, and the seed layer to form a blocking pattern, an adhesion pattern, and a seed pattern, respectively, and the protection layer further covers sidewalls of the blocking pattern, the adhesion pattern, and the seed pattern.

* * * * *